(12) United States Patent
Lin

(10) Patent No.: US 10,411,704 B1
(45) Date of Patent: Sep. 10, 2019

(54) OUTPUT IMPEDANCE CALIBRATION FOR SIGNALING

(71) Applicant: Micron Technology, Inc., Boise, ID (US)

(72) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/154,291

(22) Filed: Oct. 8, 2018

Related U.S. Application Data

(63) Continuation of application No. 15/934,663, filed on Mar. 23, 2018, now Pat. No. 10,128,842.

(51) Int. Cl.
*H03K 19/0175* (2006.01)
*H03K 19/00* (2006.01)
*G11C 7/10* (2006.01)
*G11C 5/06* (2006.01)
(Continued)

(52) U.S. Cl.
CPC ......... *H03K 19/0005* (2013.01); *G11C 5/063* (2013.01); *G11C 7/1048* (2013.01); *G11C 7/1051* (2013.01); *G11C 29/02* (2013.01); *G11C 29/022* (2013.01); *G11C 29/025* (2013.01); *G11C 29/028* (2013.01); *H03K 19/0175* (2013.01); *H03K 19/018521* (2013.01);
(Continued)

(58) Field of Classification Search
CPC ....... H03K 19/0005; H03K 19/017545; H03K 19/018557; H03K 19/018585; H03K 19/017581; H03K 17/167; H03K 19/00369; H03K 19/0175; H03K 2217/94031; H03K 17/002; H03K 17/161; H03K 17/687; H03K 17/6872; H03K 17/693; H03K 19/003; H03K 19/018521; H03K 19/17724; H04L 25/0278; H04L 25/0298; G11C 29/028; G11C 2207/2254; G11C 29/022; G11C 7/1057; G11C 29/50008; G11C 7/10; G11C 11/4093; G11C 7/1084; H03H 11/30; H03H 7/40; H03H 11/28; H01L 23/64; G06F 13/4086; G06F 3/061; H03M 1/1061; H03M 1/745
See application file for complete search history.

(56) References Cited

U.S. PATENT DOCUMENTS

| | | |
|---|---|---|
| 6,294,937 B1 | 9/2001 | Crafts et al. |
| 6,574,758 B1 | 6/2003 | Eccles |
| 7,126,378 B2 | 10/2006 | Stojanovic et al. |

(Continued)

OTHER PUBLICATIONS

ISA/KR, International Search Report and Written Opinion of the International Searching Authority, Int'l Appl. No. PCT/US2018/044377, dated Nov. 8, 2018, Korean Intellectual Property Office, Seo-gu, Daejeon, Republic of Korea, 15 pgs.

(Continued)

*Primary Examiner* — Vibol Tan
(74) *Attorney, Agent, or Firm* — Holland & Hart LLP

(57) ABSTRACT

Methods, systems, and devices for output impedance calibration for signaling are described. Techniques are provided herein to adjust impedance levels associated with data transmitted using signaling and related techniques. In some cases, the signaling may be multi-level signaling. Such signaling may be configured to increase a data transfer rate without increasing the frequency of data transfer and/or a transmit power of the communicated data.

15 Claims, 9 Drawing Sheets

(51) Int. Cl.
*G11C 29/02* (2006.01)
*H03K 19/0185* (2006.01)

(52) U.S. Cl.
CPC ............... *H03K 19/018585* (2013.01); *G11C 2207/2254* (2013.01)

(56) References Cited

U.S. PATENT DOCUMENTS

| | | | |
|---|---|---|---|
| 7,308,044 B2 * | 12/2007 | Zerbe | H04L 25/4917 327/333 |
| 7,308,058 B2 * | 12/2007 | Zerbe | H04L 1/0003 375/259 |
| 7,509,368 B2 | 3/2009 | Anders et al. | |
| 7,598,762 B2 * | 10/2009 | Byun | G11C 7/1048 324/537 |
| 7,650,526 B2 | 1/2010 | Alon et al. | |
| 7,692,447 B2 | 4/2010 | Cranford et al. | |
| 7,714,615 B2 | 5/2010 | Liang et al. | |
| 7,755,366 B2 * | 7/2010 | Hosoe | H03K 19/00384 324/601 |
| 7,853,846 B2 | 12/2010 | Cannon et al. | |
| 7,961,008 B2 | 6/2011 | Kim et al. | |
| 8,026,740 B2 | 9/2011 | Hollis | |
| 8,049,530 B2 * | 11/2011 | Batt | H03K 19/0005 324/601 |
| 8,072,253 B2 | 12/2011 | Kaeriyama et al. | |
| 8,436,653 B2 | 5/2013 | Hollis | |
| 8,570,789 B2 | 10/2013 | Chang | |
| 8,604,828 B1 | 12/2013 | Bickford et al. | |
| 8,669,792 B2 * | 3/2014 | Rao | H04L 25/0274 326/83 |
| 8,781,022 B1 | 7/2014 | Chang et al. | |
| 8,816,738 B2 | 8/2014 | Tatapudi et al. | |
| 8,854,236 B2 | 10/2014 | Hollis | |
| 9,048,824 B2 | 6/2015 | Chan et al. | |
| 9,148,170 B2 | 9/2015 | Hollis | |
| 9,203,662 B2 | 12/2015 | Hollis | |
| 9,286,697 B2 * | 3/2016 | Igarashi | G06T 9/00 |
| 9,324,454 B2 | 4/2016 | Hollis | |
| 9,337,807 B2 * | 5/2016 | Hollis | H03K 3/011 |
| 9,444,455 B2 * | 9/2016 | Bhuiyan | H03K 19/01855 |
| 9,509,535 B2 | 11/2016 | Hollis | |
| 9,525,573 B2 | 12/2016 | Fiedler | |
| 9,577,854 B1 | 2/2017 | Hollis | |
| 9,621,160 B2 * | 4/2017 | Tang | H03K 19/01754 |
| 9,712,257 B1 * | 7/2017 | Tan | H04B 14/04 |
| 9,831,874 B1 * | 11/2017 | Fortin | H03K 19/0005 |
| 9,917,711 B2 | 3/2018 | Ulrich | |
| 9,972,363 B2 * | 5/2018 | Tang | H03K 19/01754 |
| 10,015,027 B2 | 7/2018 | Schober | |
| 10,043,557 B1 * | 8/2018 | Hollis | G11C 8/10 |
| 2002/0149402 A1 | 10/2002 | Martin et al. | |
| 2004/0085841 A1 | 5/2004 | Lim et al. | |
| 2005/0258870 A1 | 11/2005 | Mitby et al. | |
| 2006/0091901 A1 | 5/2006 | Kim | |
| 2006/0091911 A1 | 5/2006 | Rho | |
| 2007/0136621 A1 | 6/2007 | Alon et al. | |
| 2008/0129348 A1 | 6/2008 | Shau | |
| 2008/0144411 A1 | 6/2008 | Tsern | |
| 2012/0092057 A1 | 4/2012 | Yu | |
| 2013/0100737 A1 | 4/2013 | Kwak | |
| 2013/0248801 A1 | 9/2013 | Yamamoto | |
| 2014/0003549 A1 | 1/2014 | Won et al. | |
| 2014/0176196 A1 | 6/2014 | Li et al. | |
| 2014/0226734 A1 | 8/2014 | Fox et al. | |
| 2015/0071651 A1 | 3/2015 | Asmanis et al. | |
| 2015/0187441 A1 | 7/2015 | Hollis | |
| 2016/0119169 A1 | 4/2016 | Schober | |
| 2016/0181950 A1 | 6/2016 | Yoscovich et al. | |
| 2016/0189775 A1 | 6/2016 | Buchanan | |
| 2016/0224243 A1 | 8/2016 | Son et al. | |
| 2016/0374091 A1 | 12/2016 | Saeki | |
| 2016/0378597 A1 | 12/2016 | Chung et al. | |
| 2017/0054656 A1 | 2/2017 | Luo et al. | |
| 2017/0075757 A1 | 3/2017 | Im et al. | |
| 2017/0118048 A1 | 4/2017 | Ulrich | |
| 2017/0212695 A1 | 7/2017 | Hollis et al. | |
| 2017/0222845 A1 | 8/2017 | Zerbe et al. | |
| 2017/0337979 A1 | 11/2017 | Lee et al. | |
| 2018/0123593 A1 * | 5/2018 | Choi | G11C 29/028 |
| 2018/0278440 A1 | 9/2018 | Dong | |
| 2019/0043543 A1 * | 2/2019 | Butterfield | G11C 7/12 |
| 2019/0044762 A1 * | 2/2019 | Lin | H04L 25/03885 |
| 2019/0044764 A1 * | 2/2019 | Hollis | H04L 25/4917 |
| 2019/0044766 A1 * | 2/2019 | Lin | H04L 25/4917 |
| 2019/0044769 A1 * | 2/2019 | Hollis | H04L 27/08 |

OTHER PUBLICATIONS

ISA/KR, International Search Report and Written Opinion of the International Searching Authority, Int'l Appl. No. PCT/US2018/043311, dated Oct. 31, 2018, Korean Intellectual Property Office, Seo-gu, Daejeon, Republic of Korea, 12 pgs.

ISA/KR, International Search Report and Written Opinion of the International Searching Authority, Int'l Appl. No. PCT/US2018/043648, dated Nov. 7, 2018, Korean Intellectual Property Office, Seo-gu, Daejeon, Republic of Korea, 14 pgs.

Nadeesha Amarasinghe "A Single-ended Simultaneously Bidirectional Transceiver for Ultra-short Reach Die to Die Links" Master of Applied Science Graduate Department of Electrical and Computer Engineering, University of Toronto, 2016, 79pgs.

Office Action dated Apr. 23, 2019 issued in Taiwan Patent Application No. 107127205, 9 pgs.

* cited by examiner

OUTPUT IMPEDANCE CALIBRATION FOR SIGNALING

CROSS REFERENCES

The present Application for Patent is a continuation of U.S. patent application Ser. No. 15/934,663, by Feng Lin, entitled "Output Impedance Calibration for Signaling," filed Mar. 23, 2018, assigned to the assignee hereof, which is expressly incorporated by reference in its entirety herein.

BACKGROUND

The following relates generally to adjusting an output from a partition of a driver and more specifically to output impedance calibration for signaling.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Some memory devices may transfer data across a large number of channels using a variety of signaling schemes, such as multi-level signaling. Such signaling schemes may be configured to increase a data transfer rate without increasing the frequency of data transfer and/or a transmit power of the communicated data. An example of one type of signaling scheme, particularly a multi-level signaling scheme, may be pulse amplitude modulation (PAM4, PAM8, etc.), where a unique symbol of the multi-level signal may be configured to represent a plurality of bits of data.

In PAM4 signaling schemes, for example, a peak-to-peak voltage difference between the various amplitudes of transferred data may exist. For example, smaller peak-to-peak margins may result from additional noise and, as a result, additional errors in the transmitted data. Alternatively, for example, larger peak-to-peak margins may result from reduced noise and, as a result, fewer errors in the data. Thus large, uniform peak-to-peak margins are desirable.

In some examples, adjusting an impedance level of data output from one or more particular driver partitions may result in larger, more-uniform (e.g., more linear) peak-to-peak margins. To adjust an impedance level output from a partition, an output impedance of at least one partition (e.g., a first partition) may be determined. In some examples, in determining the output impedance, an output impedance offset between multiple partitions (e.g., an offset between an output from a first partition and a second partition) may be determined. This impedance offset may correspond to a peak-to-peak difference between the various amplitudes of the transmitted data. Upon determining an output impedance or an output impedance offset, for example, a voltage across one or more legs of a particular partition (e.g., a voltage across at least a first leg of a first partition) may be adjusted. This adjustment may result in more-uniform peak-to-peak margins of the output data.

Features of the disclosure introduced above are further described below in the context of a memory device. Specific examples are then described for a memory device that supports output impedance calibration for signaling, including, but not limited to multi-level signaling (e.g., a signal that may be modulated using a modulation scheme that includes at least three levels to encode more than one bit of information). These and other features of the disclosure are further illustrated by and described with reference to apparatus diagrams, system diagrams, and flowcharts that relate to output impedance calibration.

Figure 1:
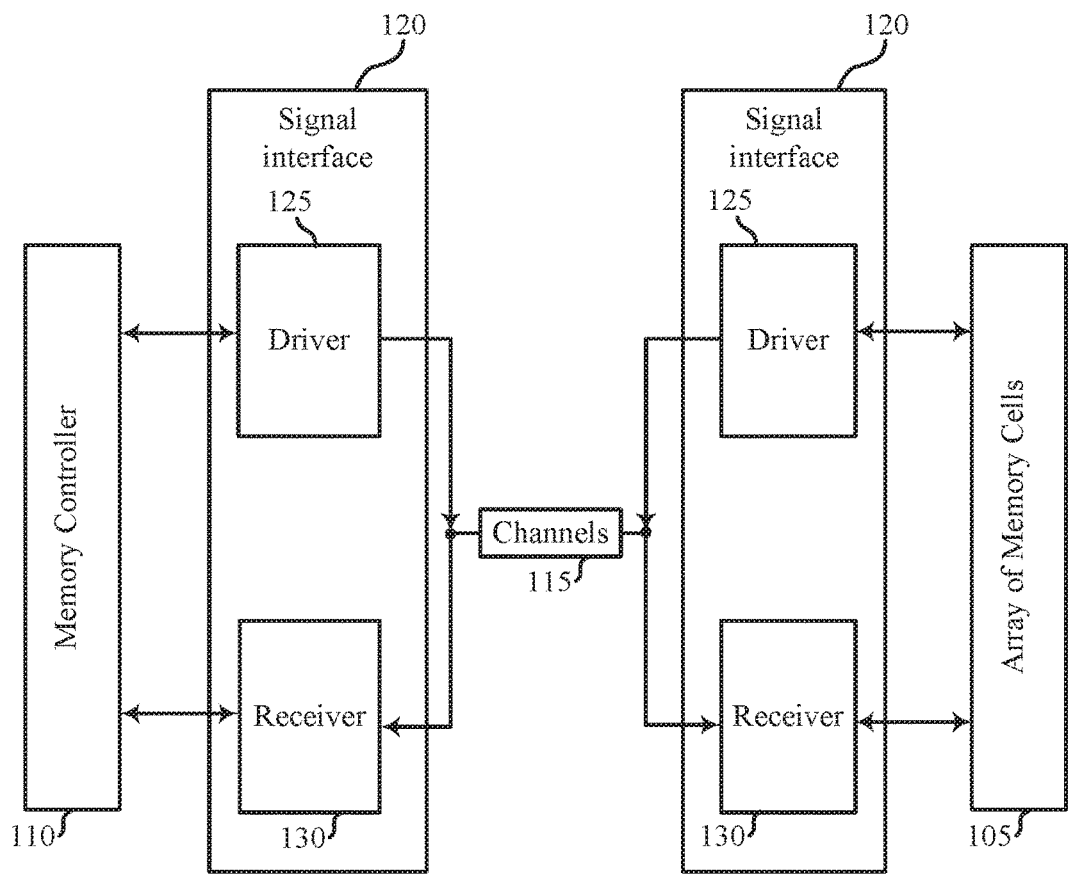
FIG. 1 illustrates an example of a memory device that supports features and operations of output impedance calibration for signaling in accordance with examples of the present disclosure.

FIG. 1 illustrates an example memory subsystem 100 in accordance with various examples of the present disclosure. The memory subsystem 100 may also be referred to as an electronic memory apparatus. The memory subsystem 100 may be configured to utilize multi-level signaling to communicate data between various components of the memory subsystem 100. Some examples of the multi-level signaling may include PAM signaling such as PAM4 signaling, PAM8 signaling, etc. The memory subsystem 100 may include an array of memory cells 105, a controller 110, a plurality of channels 115, signaling interfaces 120, other components, or a combination thereof.

A memory subsystem 100 may use multi-level signaling to increase an amount of information transmitted using a given bandwidth of frequency resources. In binary signaling, two symbols of a signal (e.g., two voltages levels) are used to represent up to two logic states (e.g., logic state '0' or logic state '1'). In multi-level signaling, a larger library of symbols may be used to represent data. Each symbol may represent more than two logic states (e.g., logic states with multiple bits). For example, if the signal is capable of four unique symbols, the signal may be used to represent up to four logic states (e.g., '00', '01', '10', and '11'). As a result, multiple bits of data may be compressed into a single symbol, thereby increasing the amount of data communicated using a given bandwidth.

In some cases of multi-level signaling, the amplitude of the signal may be used to generate the different symbols. For example, a first amplitude level may represent '00', a second amplitude level may represent '01', a third amplitude level may represent '10', and a fourth amplitude level may represent '11'. One drawback of some multi-level signaling schemes is that the symbols may be separated by a smaller voltage than symbols in a binary signaling scheme. The smaller voltage separation may make the multi-level signaling scheme more susceptible to errors caused by noise or other aspects. The voltage separation of symbols in the multi-level signaling scheme, however, may be expanded by increasing a peak-to-peak transmitted power of a transmitted signal. In some situations, however, such an increase to peak-to-peak transmitted power may not be possible or may be difficult due to fixed power supply voltages, fixed signal power requirements, or other factors. Consequently, to implement multi-level signaling a transmitter may utilize more power and/or a receiver may be susceptible to an increased error rate, when compared to a binary signaling scheme.

A multi-level signal (sometimes referred to as a multi-symbol signal) may be a signal that is modulated using a modulation scheme that includes three or more unique symbols to represent data (e.g., one or more bits of data). The multi-level signal may be an example of an M-ary signal that is modulated using a modulation scheme where M is greater than or equal to three, where M represents the number of unique symbols, levels, or conditions possible in the modulation scheme. A multi-level signal or a multi-level modulation scheme may be referred to as a non-binary signal or non-binary modulation scheme in some instances. Examples of multi-level (or M-ary) modulation schemes related to a multi-level signal may include, but are not limited to, pulse amplitude modulation (e.g., PAM4, PAM8), quadrature amplitude modulation (QAM), quadrature phase shift keying (QPSK), and/or others.

A binary-level signal (sometimes referred to as a binary-symbol signal) may be a signal that is modulated using a modulation scheme that includes two unique symbols to represent one bit of data. The binary-level signal may be an example of an M-ary modulation scheme where M is less than or equal to 2. Examples of binary-level modulation schemes related to a binary-level signal include, but are not limited to, non-return-to-zero (NRZ), unipolar encoding, bipolar encoding, Manchester encoding, PAM2, and/or others.

Each memory cell of the array of memory cells 105 may be programmable to store different states. For example, each memory cell may be programmed to store two or more logic states (e.g., a logic '0', a logic '1', a logic '00', a logic '01', a logic '10', a logic '11', etc.). A memory cell may store a charge representative of the programmable states in a capacitor; for example, a charged and uncharged capacitor may represent two logic states, respectively. The memory cells of the array of memory cells 105 may use any number of storage mediums including DRAM, FeRAM, PCM, or other types of memory cells. A DRAM memory cell may include a capacitor with a dielectric material as the insulating material. For example, the dielectric material may have linear or para-electric electric polarization properties and a ferroelectric memory cell may include a capacitor with a ferroelectric material as the insulating material. In instances where the storage medium includes FeRAM, different levels of charge of a ferroelectric capacitor may represent different logic states.

The array of memory cells 105 may be or include a three-dimensional (3D) array, where multiple two-dimensional (2D) arrays or multiple memory cells are formed on top of one another. Such a configuration may increase the number of memory cells that may be formed on a single die or substrate as compared with 2D arrays. In turn, this may reduce production costs or increase the performance of the memory array, or both. Each level of the array may be aligned or positioned so that memory cells may be approximately aligned with one another across each level, forming a memory cell stack.

In some examples, the array of memory cells 105 may include a memory cell, a word line, a digit line, and a sense component. In some examples, the array of memory cells 105 may include a plate line (e.g., in the case of FeRAM). A memory cell of the array of memory cells 105 may include a selection component and a logic storage component, such as capacitor that includes a first plate, a cell plate, a second plate, and a cell bottom. The cell plate and cell bottom may be capacitively coupled through an insulating material (e.g., dielectric, ferroelectric, or PCM material) positioned between them.

The memory cell of the array of memory cells 105 may be accessed (e.g., during a read operation, write operation, or other operation) using various combinations of word lines, digit lines, and/or plate lines. In some cases, some memory cells may share access lines (e.g., digit lines, word lines, plate lines) with other memory cells. For example, a digit line may be shared with memory cells in a same column, a word line may be shared with memory cells in a same row, and a plate line may be shared with memory cells in a same section, tile, deck, or multiple decks. As described herein, various states may be stored by charging or discharging the capacitor of the memory cell.

The stored state of the capacitor of the memory cell may be read or sensed by operating various elements. The capacitor may be in electronic communication with a digit line. The capacitor may be isolated from digit line when selection component is deactivated, and capacitor can be connected to digit line when selection component is activated (e.g., by the word line). Activating selection component may be referred to as selecting a memory cell. In some cases, the selection component may be a transistor and its operation may be controlled by applying a voltage to the transistor gate, where the voltage magnitude is greater than the threshold magnitude of the transistor. The word line may activate the selection component; for example, a voltage applied to a transistor gate of a word line may connect a capacitor of a memory cell with a digit line.

The change in voltage of a digit line may, in some examples, depend on its intrinsic capacitance. That is, as charge flows through the digit line, some finite charge may be stored in the digit line and the resulting voltage depends on the intrinsic capacitance. The intrinsic capacitance may depend on physical characteristics, including the dimensions, of the digit line. The digit line may connect many memory cells of the array of memory cells 105 so digit line may have a length that results in a non-negligible capacitance (e.g., on the order of picofarads (pF)). The resulting voltage of the digit line may then be compared to a reference voltage (e.g., a voltage of a reference line) by a sense component in order to determine the stored logic state in the memory cell. Other sensing processes may be used.

The sense component may include various transistors or amplifiers to detect and amplify a difference in signals, which may be referred to as latching. The sense component may include a sense amplifier that receives and compares the voltage of the digit line and a reference line, which may be a reference voltage. The sense amplifier output may be driven to the higher (e.g., a positive) or lower (e.g., negative or ground) supply voltage based on the comparison. For instance, if the digit line has a higher voltage than reference line, then the sense amplifier output may be driven to a positive supply voltage.

In some cases, the sense amplifier may drive the digit line to the supply voltage. The sense component may then latch the output of the sense amplifier and/or the voltage of the digit line, which may be used to determine the stored state in the memory cell (e.g., logic '1'). Alternatively, for example, if the digit line has a lower voltage than reference line, the sense amplifier output may be driven to a negative or ground voltage. The sense component may similarly latch the sense amplifier output to determine the stored state in the memory cell (e.g., logic '0'). The latched logic state of the memory cell may then be output, for example, through a column decoder.

To write a memory cell, a voltage may be applied across the capacitor of the memory cell. Various methods may be used to write a memory cell. In one example, the selection component may be activated through a word line in order to electrically connect the capacitor to the digit line. A voltage may be applied across the capacitor by controlling the voltage of the cell plate (e.g., through a plate line) and the cell bottom (e.g., through a digit line). To write a logic '0', the cell plate may be taken high (e.g., a voltage level may be increased above a predetermined voltage that is a "high" voltage). That is, a positive voltage may be applied to plate line, and the cell bottom may be taken low (e.g., virtually grounding or applying a negative voltage to the digit line). The opposite process may be performed to write a logic '1', where the cell plate is taken low and the cell bottom is taken high.

The controller 110 may control the operation (e.g., read, write, re-write, refresh, precharge, etc.) of memory cells in the array of memory cells 105 through the various components (e.g., row decoders, column decoders, and sense components). In some cases, one or more of the row decoder, column decoder, and sense component may be co-located with the controller 110. Controller 110 may generate row and column address signals in order to activate the desired word line and digit line. In other examples, controller 110 may generate and control various voltages or currents used during the operation of memory subsystem 100. For example, controller 110 may apply discharge voltages to a word line or digit line after accessing one or more memory cells. In general, the amplitude, shape, or duration of an applied voltage or current discussed herein may be adjusted or varied and may be different for the various operations discussed in operating the memory subsystem 100. Furthermore, one, multiple, or all memory cells within the array of memory cells 105 may be accessed simultaneously. For example, multiple memory cells or all memory cells of the array of memory cells 105 may be accessed simultaneously during a reset operation in which multiple memory cells or all memory cells may be set to a single logic state (e.g., logic '0').

Each of the plurality of channels 115 may be configured to couple the array of memory cells 105 with the controller 110. In some examples, each driver 125 may include a plurality of legs. In some examples, the plurality of legs of a respective driver may be referred to as or may be subdivided into one or more groups (e.g., a first leg group, a second leg group). In some memory devices, the rate of data transfer between the memory device and a host device (e.g., a personal computer or other computing device) may be limited by the rate of data transferred across the plurality of channels 115. In some examples, the memory subsystem 100 may include a large number of high-resistance channels. By increasing the number of channels, the amount of data transferred in the memory subsystem 100 may be increased without increasing the data rate of the transfer. In some examples, the plurality of channels 115 may be referred to as a wide system interface. Each of the plurality of channels 115 may be part of an interposer positioned between the array of memory cells 105 and the controller 110. In some examples, one or more of the channels 115 may be unidirectional and in other examples, one or more of the channels 115 may be bidirectional.

In some examples, at least some (and in some cases, each) of the signaling interfaces 120 may generate and/or decode signals communicated using the plurality of channels 115. A signaling interface 120 may be associated with each component that is coupled with the plurality of channels 115. The signaling interface 120 may be configured to generate and/or decode multi-level signals, binary signals, or both (e.g., simultaneously). Each signaling interface 120 may include a driver 125 and a receiver 130. In some examples, each driver 125 may be referred to as a multi-leg driver.

Each driver 125 may be configured to generate a multi-level signal based on a logic state that includes multiple bits. For example, driver 125 may use PAM4 signaling techniques (or other types of multi-level signaling techniques) to generate a signal having an amplitude that corresponds to the logic state. The driver 125 may be configured to receive data using a single input line. In some cases, the driver 125 may include a first input line for a first bit of data (e.g., most-significant bit), a second input line for a second bit of data (e.g., least-significant bit). In some circumstances, the driver 125 may be configured to generate a binary-level signal (e.g., a NRZ signal). In some cases, the driver 125 may use single-ended signaling to generate the multi-level signal. In such cases, the multi-level signal may be transmitted without a complimentary component.

In some cases, each driver 125 may include multiple partitions. Each partition may include a plurality of legs (e.g., a first plurality of legs) coupled with at least one resistive component (e.g., a transistor or a resistor). For example, a first partition of driver 125 may include a first plurality of legs coupled with a first resistor and a first transistor. The first partition may be associated with an output impedance and, in some examples, the output impedance of the first partition may be adjusted by adjusting a voltage level of at least one leg of the first plurality of legs. Adjusting the voltage level of at least one leg may adjust or initiate an adjustment of the first partition from a first impedance level to a second impedance level, which may be different from the first impedance level.

Additionally or alternatively, for example, each driver 125 may be coupled with memory controller 110. In some examples, the memory controller 110 may be configured to determine an output impedance of at least one of the first partition or the second partition. Stated alternatively, data output from each of the first partition and/or the second partition (e.g., first data output from the first partition and/or second data output from the second partition) may be associated with a respective impedance level. In some examples, memory controller 110 may be configured to determine a difference (e.g., an offset) between the impedance level of each of the first data and the second data. After determining the offset, the memory controller 110 may be configured to initiate an adjustment of the first partition from a first impedance level to a second impedance level based at least in part on the determination. As discussed herein, in some examples, the adjustment may be based in part on adjusting a voltage level of at least one leg (e.g., of a plurality of legs) associated with either the first partition or the second partition.

Each receiver 130 may be configured to determine a logic state represented by a symbol of the multi-level signal received using the plurality of channels 115. In some cases, the receiver 130 may determine an amplitude of the received multi-level signal. Based on the determined amplitude, the receiver 130 may determine the logic state represented by the multi-level signal. The receiver 130 may be configured to output data using a single output line.

In some cases, the receiver 130 may include a first output line for a first bit of data (e.g., most-significant bit), a second output line for a second bit of data (e.g., least-significant bit). In some circumstances, the receiver 130 may be configured to decode a multi-level signal (e.g., a PAM4 signal). Each of the channels 115 may be configured to output data associated with a particular impedance level (e.g., a first impedance level, a second impedance level), and the controller 110 may be configured to determine an output impedance offset between the data output. As discussed herein, the controller 110 may be configured to initiate an adjustment of the first partition from a first impedance level to a second impedance level based at least in part on the determining the output impedance offset.

In some cases, each of the signaling interfaces 120 may be configured to selectively generate and/or decode different types of signals (e.g., NRZ signals, PAM4 signals, PAM8 signals, etc.). Different types of signals may be used based on the operational circumstances of the memory subsystem 100. For example, binary signaling may use less power than multi-level signaling and may be used when power consumption is driving consideration for performance. Other performance factors that may be used to determine which type of signaling should be used may include clock considerations, data strobe (DQS) considerations, circuit capabilities, bandwidth considerations, jitter considerations, or combinations thereof. In some cases, the controller 110 may be configured to select the type of signal, and the signaling interfaces 120 may be configured to implement the selection based on instructions received from the controller 110. In some cases, each of the signaling interfaces 120 may be configured to implement coding functions such as error detection procedures, error correction procedures, data bus inversion procedures, or combinations thereof.

In some cases, the signaling interfaces 120 may be configured to communicate multi-level signals and binary signals simultaneously. In such cases, a signaling interface 120 may include more than one set of drivers 125 and receivers 130. For example, a signaling interface 120 may be configured to communicate a first set of data (e.g., a control signal) using a binary-level signal using a first set of channels 115 at the same time that a second set of data (e.g., user information) is being communicated using a multi-level signal using a second set of channels 115.

Figure 2:
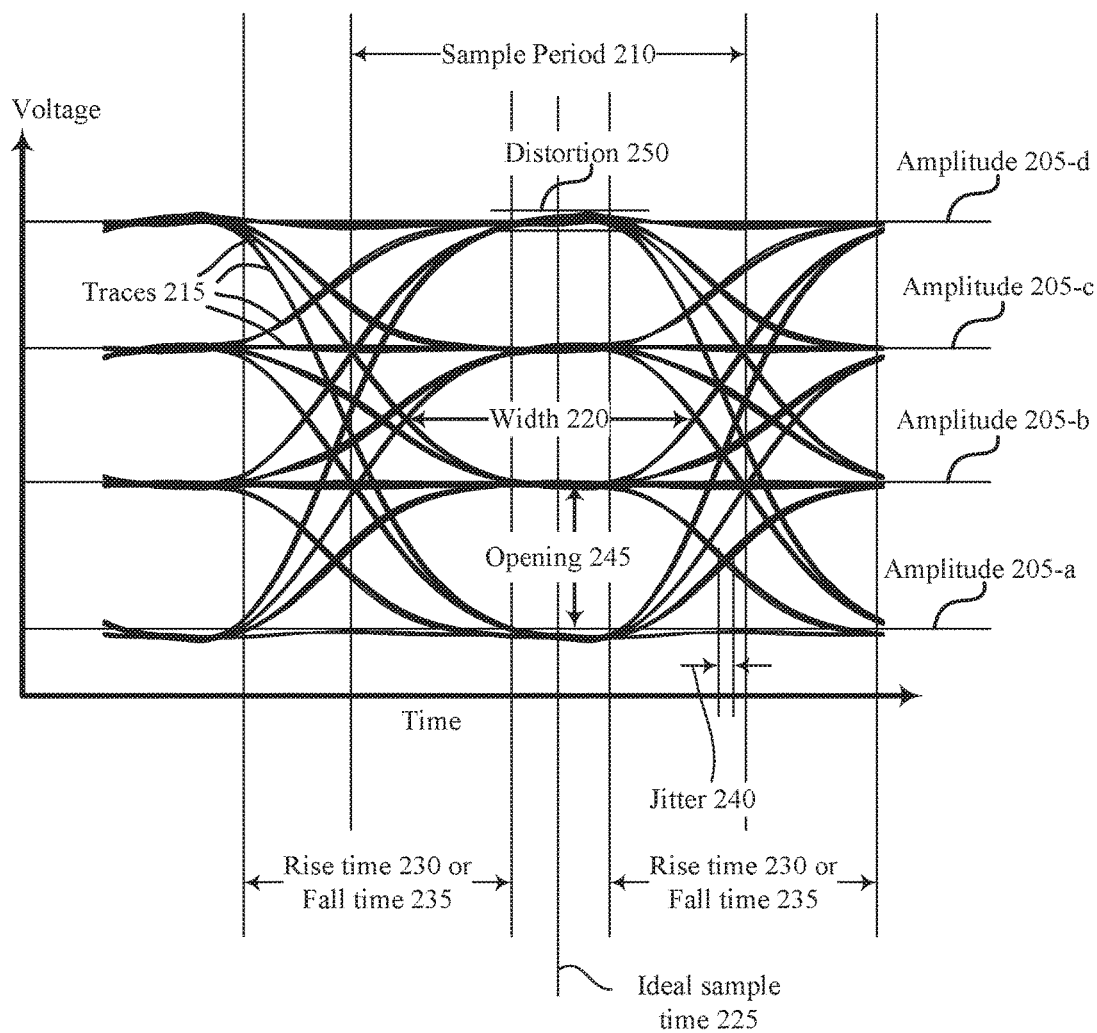
FIG. 2 illustrates an example of an eye diagram for a cell that supports features and operations of output impedance calibration for signaling in accordance with examples of the present disclosure.

FIG. 2 illustrates an example of an eye diagram 200 representing a multi-level signal in accordance with various examples of the present disclosure. The eye diagram 200 may be used to indicate the quality of signals in high-speed transmissions and may represent four symbols of a signal (e.g., '00', '01', '10', or '11'). In some examples, each of the four symbols may be represented by a different voltage amplitude (e.g., amplitudes 205-$a$, 205-$b$, 205-$c$, 205-$d$). In other examples, the eye diagram 200 may represent a PAM4 signal that may be used to communicate data in a memory device (e.g., memory subsystem 100 as described with reference to FIG. 1). The eye diagram 200 may be used to provide a visual indication of the health of the signal integrity, and may indicate noise margins of the data signal. The noise margin may, for example, refer to an amount by which the signal exceeds the ideal boundaries of the amplitudes 205.

To generate the eye diagram 200, an oscilloscope or other computing device may sample a digital signal according to a sample period 210 (e.g., a unit interval or a bit period). The sample period 210 may be defined by a clock associated with the transmission of the measured signal. In some examples, the oscilloscope or other computing device may measure the voltage level of the signal during the sample period 210 to form a trace 215. Noise and other factors can result in the traces 215 measured from the signal deviating from a set of ideal step functions. By overlaying a plurality of traces 215, various characteristics about the measured signal may be determined. For example, the eye diagram 200 may be used to identify a number of characteristics of a communication signals such as jitter, cross talk, electromagnetic interference (EMI), signal loss, signal-to-noise ratio (SNR), other characteristics, or combinations thereof. A closed eye may indicate a noisy and/or unpredictable signal or other problems.

In some examples, the eye diagram 200 may indicate a width 220. The width 220 of an eye in the eye diagram 200 may be used to indicate a timing synchronization of the measured signal or jitter effects of the measured signal. In some examples, comparing the width 220 to the sample period 210 may provide a measurement of SNR of the measured signal. Each eye in an eye diagram may have a unique width based on the characteristics of the measured signal. Various encoding and decoding techniques may be used to modify the width 220 of the measured signal.

In other examples, the eye diagram 200 may indicate a sampling time 225 (e.g., an ideal sampling time) for determining the value of a logic state represented by a symbol of the measured signal. For example, determining a correct time for sampling data (e.g., timing synchronization) of the measured signal may be important to minimize the error rate in detection of the signal. For example, if a computing device samples a signal during a transition time (e.g., a rise time 230 or a fall time 235), errors may be introduced by the decoder into the data represented by a symbol of the signal.

Various encoding and decoding techniques may be used to modify the ideal sampling time 225 of the measured signal.

The eye diagram 200 may be used to identify a rise time 230 and/or a fall time 235 for transitions from a first amplitude 205 to a second amplitude 205. The slope of the trace 215 during the rise time 230 or fall time 235 may indicate the signal's sensitivity to timing error, among other aspects. For example, the steeper the slope of the trace 215 (e.g., the smaller the rise time 230 and/or the fall times 235), the more ideal the transitions between amplitudes 205 are. Various encoding and decoding techniques may be used to modify the rise time 230 and/or fall time 235 of the measured signal.

In some examples, the eye diagram 200 may be used to identify an amount of jitter 240 in the measured signal. Jitter 240 may refer to a timing error that results from a misalignment of rise and fall times. Jitter 240 occurs when a rising edge or falling edge occurs at a time that is different from an ideal time defined by the data clock. Jitter 240 may be caused by signal reflections, intersymbol interference, crosstalk, process-voltage-temperature (PVT) variations, random jitter, additive noise, or combinations thereof. Various encoding and decoding techniques may be used to modify the jitter 240 of the measured signal. In some cases, the jitter 240 for each signal level or each eye may be different.

In other examples, the eye diagram 200 may indicate an eye opening 245, which may represent a peak-to-peak voltage difference between the various amplitudes 205. The eye opening 245 may be related to a voltage margin for discriminating between different amplitudes 205 of the measured signal. The smaller the margin, the more difficult it may be to discriminate between neighboring amplitudes, and the more errors that may be introduced due to noise. In some cases, a receiver (e.g., receiver 130 as described with reference to FIG. 1) of the signal may compare the signal to one or more threshold voltages positioned between the various amplitudes 205. In other cases, the larger the eye opening 245, the less likely it is that noise will cause the one or more voltage thresholds to be satisfied in error. The eye opening 245 may be used indicate an amount of additive noise in the measured signal, and may be used to determine a SNR of the measured signal. Various encoding and decoding techniques may be used to modify the eye opening 245 of the measured signal. In some cases, the eye opening 245 for each eye may be different. In such cases, the eyes of the multi-level signal may not be identical.

As discussed herein, a memory device (e.g., memory subsystem 100 as described with reference to FIG. 1) may include a driver (e.g., driver 125 as described with reference to FIG. 1) that includes one or more partitions. Each partition may include, for example, a plurality of legs (e.g., a first plurality of legs of a first partition) that is coupled with one or more resistive components. Each partition may be configured to output data (e.g., first data output from a first partition and second data output from a second partition). Additionally or alternatively, for example, a memory controller (e.g., memory controller 110 as described with reference to FIG. 1) and/or a transmitter (not shown) may be coupled with the multi-leg driver. The memory controller may be configured to determine an output impedance of data output from a particular partition. For example, the memory controller may be configured to determine an output impedance of at least one of a first partition or a second partition based at least in part on receiving at least one of the first data and the second data. In some examples, the memory controller may initiate an adjustment of the first partition from a first impedance level to a second impedance level based at least in part on the determination and the transmitter may transmit the adjusted data.

In some examples, the transmitted data (e.g., the data transmitted after an adjustment of a respective impedance level) may contain an eye opening 245, which may represent a peak-to-peak voltage difference between the various amplitudes 205. A memory controller (e.g., memory controller 110 as described with reference to FIG. 1) may determine a difference (e.g., an offset) between two or more eye openings 245, which may result from a determination of an output impedance level of data associated with the respective eye openings 245. Additionally or alternatively, for example, a memory controller may initiate an adjustment of data output from a respective partition which, in some examples, may be performed by adjusting a voltage level of one or more legs (e.g., of a plurality of legs) associated a particular partition. In some examples, a voltage level may be adjusted by enabling or disabling one or more transistors coupled with a particular leg or with particular legs associated with a partition. This adjustment may, in some examples, result in larger, more-uniform eye openings 245.

In other examples, the eye diagram 200 may indicate distortion 250. The distortion 250 may represent overshoot and/or undershoot of the measured signal due to noise or interruptions in the signal path. As a signal settles into a new amplitude (e.g., amplitude 205-b) from an old amplitude (e.g., an amplitude 205-c), the signal may overshoot and/or undershoot the new amplitude level. In some examples, distortion 250 may be caused by this overshooting and/or undershooting, and may be caused additive noise in the signal or interruptions in the signal path. Each eye in an eye diagram may have a unique opening based on the characteristics of the measured signal. Various encoding and decoding techniques may be used to modify the distortion 250 of the measured signal. In some cases, the distortion 250 for each signal level or each eye may be different.

The locations of the characteristics of the eye diagram 200 shown in FIG. 2 are for illustrative purposes only. Characteristics such as width 220, sampling time 225, rise time 230, fall time 235, jitter 240, eye opening 245, and/or distortion 250 may occur in other parts of the eye diagram 200 not specifically indicated in FIG. 2.

Figure 3:
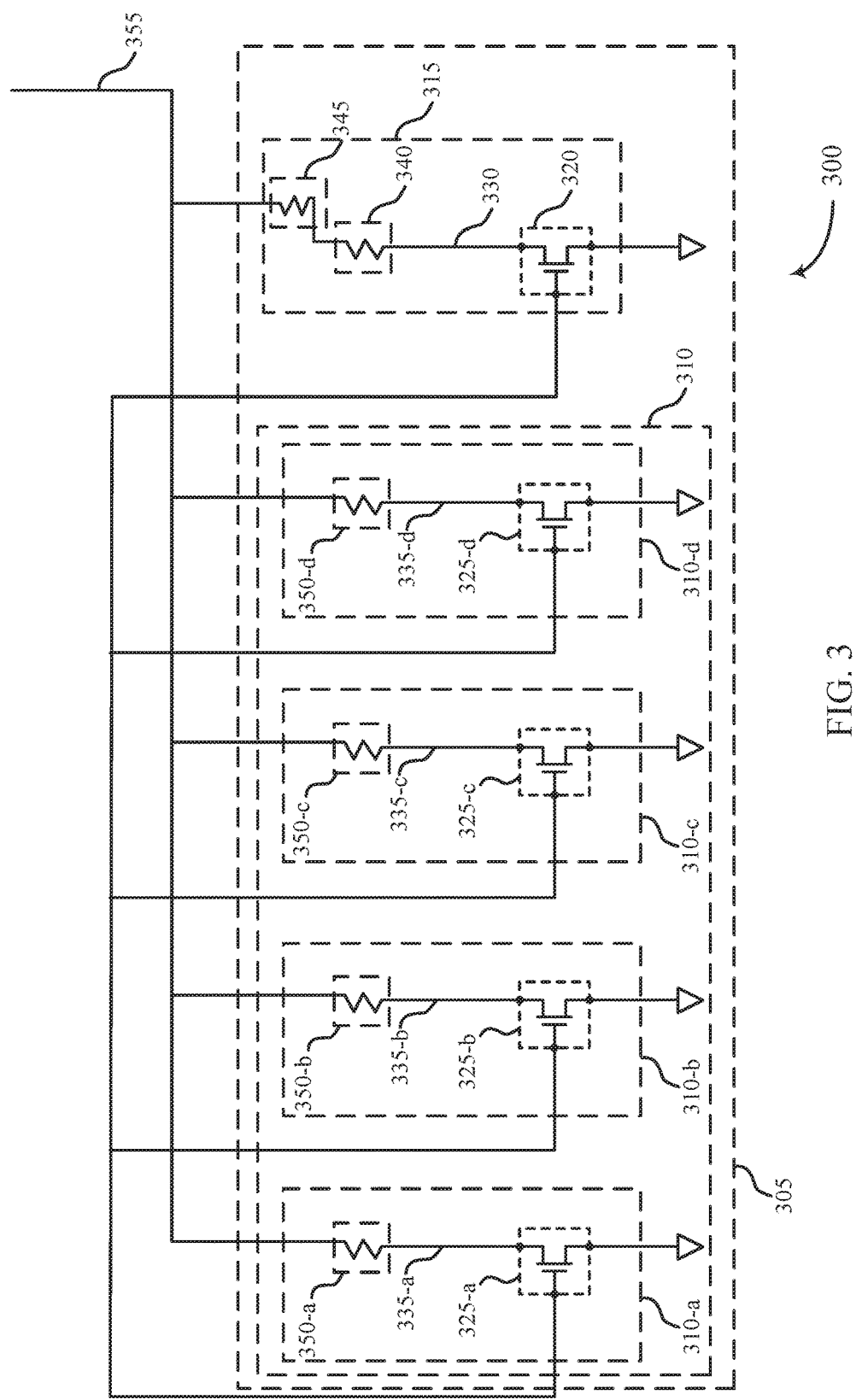
FIGS. 3 through 4 illustrate examples of a memory device that supports features and operations of output impedance calibration for signaling in accordance with examples of the present disclosure.

FIG. 3 illustrates an example memory device 300 in accordance with various examples of the present disclosure. The memory device 300 may also be referred to as memory driver 300 and may be an example of driver 125 as described with reference to FIG. 1. In some examples, memory driver 300 may be associated with graphics operations and thus may be configured to operate at a higher voltage than memory driver 400 as described below with reference to FIG. 4. Memory driver 300 may be configured to utilize signaling to communicate data between various components of the memory subsystem 100. In some examples, this signaling to communicate data between various components may include, but is not limited to multi-level signaling (e.g., a signal that may be modulated using a modulation scheme that includes at least three levels to encode more than one bit of information including, but not limited to, PAM4 signaling). Memory driver 300 may include first partition 305, which may include leg groups 310 and 315, which may be referred to as first leg group 310 and second leg group 315, respectively. In other examples, memory driver 300 may include one or more additional partitions (e.g., a second partition that is not shown). As discussed more herein in other sections, a driver (such as driver 300 or driver 400) can have multiple partitions, with a first partition of the multiple partitions (such as first partition 305) that may be calibrated based on a target impedance (e.g., 120 ohm). In some examples, the controller may determine a desired impedance offset for one or more partitions (e.g., first partition 305, a second partition that is not shown) to increase output uniformity. In some examples, first leg group 310 may include legs (e.g., a plurality of legs) 310-*a*, 310-*b*, 310-*c*, and 310-*d*. Each of legs 310-*a*, 310-*b*, 310-*c*, and 310-*d* may, in some examples, be referred to as first plurality of legs 310-*a*, 310-*b*, 310-*c*, and 310-*d*, respectively.

In some examples, each of first plurality of legs 310-*a*, 310-*b*, 310-*c*, and 310-*d* may include a transistor and a resistor coupled with each leg. For example, plurality of legs 310-*a* (e.g., of the first leg group 310) may include a leg 335-*a* that is coupled with a transistor 325-*a* and a resistor 350-*a*. In some examples, leg 335-*a* may be referred to as a first leg, transistor 325-*a* may be referred to as a first transistor 325-*a*, and resistor 350-*a* may be referred to as a first resistive component 350-*a*. The plurality of legs 310-*a* may be coupled with a voltage source such that a voltage may be applied to one or more legs (e.g., to leg 335-*a*). For example, a voltage may be applied to leg 335-*a* by activating first transistor 325-*a*.

As described herein, each of plurality of legs 310-*a*, 310-*b*, 310-*c*, and 310-*d* may include a transistor and a resistor coupled with each leg. Thus, in some examples, plurality of legs 310-*b* may include leg 335-*b* coupled with transistor 325-*b* and resistor 350-*b*, plurality of legs 310-*c* may include leg 335-*c* coupled with transistor 325-*c* and resistor 350-*c*, and plurality of legs 310-*d* may include leg 335-*d* coupled with transistor 325-*d* and resistor 350-*d*. Additionally or alternatively, each of plurality of legs 310-*b*, 310-*c*, and 310-*d* may be coupled with a voltage source. Accordingly, a voltage may be applied to each leg of each plurality of legs by activating a respective transistor. By activating one or more of or a particular combination of transistors (e.g., applying a voltage to leg 335-*a* by activating transistor 325-*a*, and applying a voltage to leg 335-*d* by activating transistor 325-*d*), an impedance output (e.g., an impedance level) of the first leg group 310 may be adjusted. Accordingly, activating different combinations of transistors may allow for a wide range of adjustment of the output impedance level of the first leg group 310.

In some examples, one or more of legs 310-*a*, 310-*b*, 310-*c*, and 310-*d* of the first leg group 310 may be referred to as a unit cell. Accordingly, one or more of legs 310-*a*, 310-*b*, 310-*c*, and 310-*d* may be or may include a binary weighted leg. Because the first leg group 310 may, in some examples, include multiple legs (e.g., a first plurality of legs), one or more binary weighted legs may allow for a binary-weighted impedance adjustment of leg group 310. Stated another way, because the first leg group 310 may include first plurality of legs 310-*a*, 310-*b*, 310-*c*, and 310-*d*, the output impedance level of the first leg group 310 may be adjusted with different (e.g., greater) granularity than the second leg group 315 based on the number of pluralities of legs.

As shown in FIG. 3, second leg group 315 may include a leg 330 that is coupled with a transistor 320 and resistors 340 and 345. In some examples, leg 330 may be referred to as a second leg, transistor 320 may be referred to as a second transistor 320, resistor 340 may be referred to as a second resistive component 340, and resistor 345 may be referred to as a third resistive component 345. In some examples, each of resistors 340 and 345 may be considered to be a single resistive component and may be referred to as second resistive component 340. In some examples, each of the plurality of legs of the second leg group 315 may be coupled with a voltage source. Accordingly, a voltage may be applied to each leg of each second plurality of legs by activating a respective transistor.

By activating one or more of or a particular combination of transistors (e.g., applying a voltage to leg 330 by activating transistor 320), an impedance output (e.g., an impedance level) of the second leg group 315 may be adjusted. Resistive component 340 may, in some examples, adjust an impedance level of the second leg group 315. In some examples, due to the second leg group 315 including multiple resistive components (e.g., resistive components 340, 345), an output impedance level of the second leg group 315 may be adjusted with different (e.g., greater) granularity than an individual leg of the first leg group. For example, a voltage may be applied to leg 330 and may subsequently be applied to resistive component 340, which may adjust the impedance level output from the second leg group 315. Because the first leg group 310 may, in some examples, include multiple legs (e.g., a first plurality of legs), and the second leg group 315 may, in some examples, include one leg (e.g., a second plurality of legs), the output impedance level of the first leg group 310 may be adjusted with different (e.g., greater) granularity than the second leg group 315.

In some examples, a determination of an output impedance level of the first leg group 310, the second leg group 315, or both may be made before adjusting a respective impedance level. For example, a memory controller (e.g., memory controller 110 as described with reference to FIG. 1) may determine an output impedance of at least one of the first leg group 310 or the second leg group 315 based at least in part on receiving the first data and the second data (e.g., first data received from first leg group 310 and second data received from second leg group 315). In other examples, a determination of an output impedance level of the first partition 305 may be made before adjusting an impedance level of a respective leg group. For example, a memory controller (e.g., memory controller 110 as described with reference to FIG. 1) may determine an output impedance of the first partition 305 based at least in part on receiving the first data and the second data (e.g., first data received from first leg group 310 and second data received from second leg group 315).

In some examples, the memory controller may initiate an adjustment of first leg group 310 from a first impedance level to a second impedance level (e.g., a second impedance level different from the first impedance level, which may be higher or lower) based at least in part on the determination. Additionally or alternatively, the memory controller may initiate an adjustment of the second leg group 315 from a third impedance level to a fourth impedance level (e.g., a fourth impedance level different from the third impedance level, which may be higher or lower) based at least in part on the determination. As described herein, an output impedance level of a particular leg group may be adjusted by activating a combination of transistors to apply a voltage to a respective leg of the partition. A resistive component coupled with the leg may then adjust an impedance level of the leg group based at least in part on the application of the voltage (e.g., the voltage applied to the respective leg).

In other examples, the memory controller may initiate an adjustment of the first partition 305 from a first impedance level to a second impedance level (e.g., a second impedance level different from the first impedance level, which may be higher or lower) based in part on the determination of an output impedance level of the first partition 305, or based in part on the determination of an output impedance level of one or more leg groups. Additionally or alternatively, the memory controller may initiate an adjustment of a second partition (not shown) from a third impedance level to a fourth impedance level (e.g., a fourth impedance level different from the third impedance level, which may be higher or lower) based at least in part on the determination. As described herein, an output impedance level of a particular partition may be adjusted by activating a combination of transistors of one or more leg groups to apply a voltage to the respective group. A resistive component coupled with a particular leg of the leg group may then adjust an impedance level of the leg group based at least in part on the application of the voltage.

In some examples, after an output impedance level of the first leg group 310 and/or the second leg group 315 has been adjusted, an output impedance offset may be determined between the first output data and the second output data. Stated another way, the output impedance level of the first leg group 310 and the output impedance level of the second leg group 315 may not be uniform after a first adjustment. For example, an output impedance level of the first leg group 310 may be greater or lesser than an output impedance level of the second leg group 315 after a first adjustment. Thus in some examples, based on determining an offset between the two impedance levels, at least a third adjustment may occur. For example, if an offset is determined between the two impedance levels, the impedance level of the first leg group 310 may be further adjusted (e.g., to a fourth impedance level). In other examples, if an offset is determined between the two impedance levels, the impedance level of the second leg group 315 may be further-adjusted (e.g., to a fifth impedance level). As described herein, among other examples and techniques, an impedance level of a particular leg group may be adjusted by applying a voltage to one or more legs that are each coupled with a transistor and a resistive component by activating a particular transistor or combination of transistors.

In other examples, after an output impedance level of the first partition 305 and/or the second partition (not shown) has been adjusted, an output impedance offset may be determined between the data output from the respective partitions. Stated another way, the output impedance level of the first partition and the output impedance level of the second partition may not be uniform after a first adjustment. For example, an output impedance level of the first partition 305 may be greater or lesser than an output impedance level of the second partition (not shown) after a first adjustment. Thus in some examples, based on determining an offset between the two impedance levels, at least a third adjustment may occur. Additionally or alternatively, at least one of the partitions (e.g., first partition 305) may be calibrated based in part on a target impedance level (e.g., 120Ω). A memory controller may then, for example, determine a desirable impedance offset between the partitions, which may result in improved uniformity between the impedance levels output from multiple partitions.

In some examples, after adjusting an output impedance level of the first leg group 310, the second leg group 315, or both, (or the first partition 305 and a second partition) the first data and second data may be output by a respective driver (e.g., driver 300). The first data and second data may be output by, for example, by a control line of the respective driver (e.g. control line 355).

Figure 4:
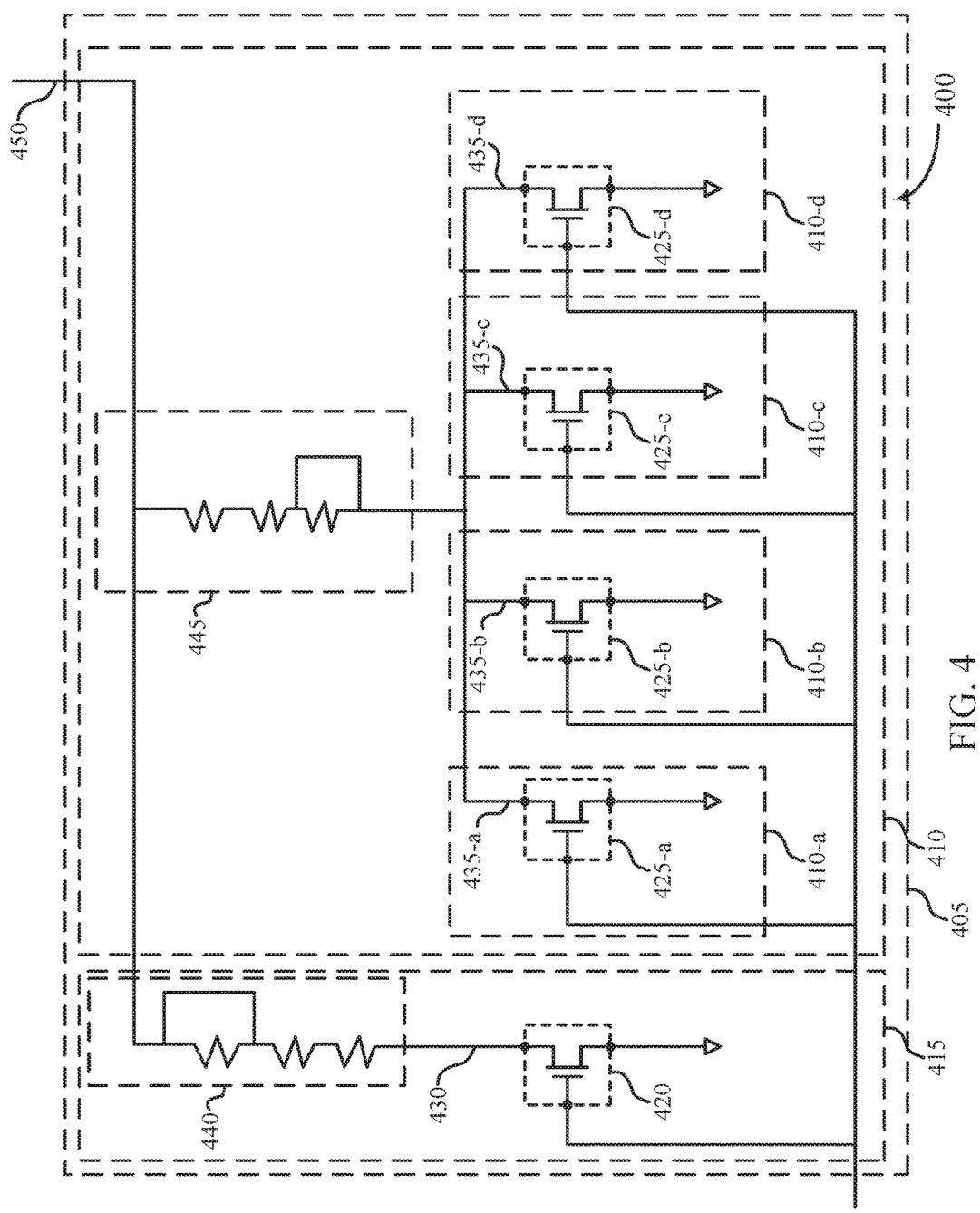

FIG. 4 illustrates an example memory device 400 in accordance with various examples of the present disclosure. The memory device 400 may also be referred to as memory driver 400 and may be an example of driver 125 as described with reference to FIG. 1. In some examples, memory driver 400 may be associated with non-graphics operations and thus may be configured to operate at a lower voltage than memory driver 300 as described above with reference to FIG. 3. Memory driver 400 may be configured to utilize signaling to communicate data between various components of the memory subsystem 100. In some examples, this signaling to communicate data between various components may include, but is not limited to multi-level signaling (e.g., a signal that may be modulated using a modulation scheme that includes at least three levels to encode more than one bit of information including, but not limited to, PAM4 signaling). Memory driver 400 may include first partition 405, which includes leg groups 410 and 415, which may be referred to as first leg group 410 and second leg group 415 respectively. In other examples, memory driver 400 may include additional partitions (e.g., a second partition; not shown). In some examples, first leg group 410 may include legs (e.g., plurality of legs) 410-*a*, 410-*b*, 410-*c*, and 410-*d*. Each of legs 410-*a*, 410-*b*, 410-*c*, and 410-*d* may, in some examples, be referred to as first plurality of legs 410-*a*, 410-*b*, 410-*c*, and 410-*d*, respectively.

In some examples, each of first plurality of legs 410-*a*, 410-*b*, 410-*c*, and 410-*d* may include a transistor and a resistor coupled with each leg. For example, plurality of legs 410-*a* (e.g., of the first leg group 410) may include a leg 435-*a* that is coupled with a transistor 425-*a*. In some examples, leg 435-*a* may be referred to as a first leg and transistor 425-*a* may be referred to as a first transistor 425-*a*. The plurality of legs 410-*a* may be coupled with a voltage source such that a voltage may be applied to one or more legs (e.g., to leg 435-*a*). For example, a voltage may be applied to leg 435-*a* by activating first transistor 425-*a*.

As described herein, each of plurality of legs 410-*a*, 410-*b*, 410-*c*, and 410-*d* may include a transistor coupled with each leg. Thus, in some examples, plurality of legs 410-*b* may include leg 435-*b* coupled with transistor 425-*b*, plurality of legs 410-*c* may include leg 435-*c* coupled with transistor 425-*c*, and plurality of legs 410-*d* may include leg 435-*d* coupled with transistor 425-*d*. Each of the first plurality of legs 410-*a*, 410-*b*, 410-*c*, and 410-*d* may be coupled with resistor 445, which may be referred to as a first resistive component 445 or an adjustable resistive component 445.

Additionally or alternatively, each of plurality of legs 410-*b*, 410-*c*, and 410-*d* may be coupled with a voltage source. Accordingly, a voltage may be applied to each leg of each plurality of legs by activating a respective transistor. By activating a particular combination of transistors (e.g., applying a voltage to leg 435-*a* by activating transistor 425-*a*, and applying a voltage to leg 435-*d* by activating transistor 425-*d*), an impedance output (e.g., an impedance level) of the first leg group 410 may be adjusted. In some examples, the impedance level output of the first leg group 410 may be adjusted by first resistive component 445. Accordingly, activating one or more or different combinations of transistors may allow for a wide or an increased range of adjustment of the output impedance level of the first leg group 410.

In some examples, second leg group 415 may include a second plurality of legs that are each coupled with a transistor. Because the second leg group 415 may include one plurality of legs (e.g., a second plurality of legs, a single plurality of legs), an output impedance level of the second leg group 415 may be adjusted based on the adjustment of the second plurality of legs. Stated another way, because the first leg group 410 may include first plurality of legs 410-*a*, 410-*b*, 410-*c*, and 410-*d*, the output impedance level of the first leg group 410 may be adjusted with different (e.g., greater) granularity than the second leg group 415 based on the number of pluralities of legs.

As shown in FIG. 4, second leg group 415 may include a leg 430 that is coupled with a transistor 420 and resistor 440. In some examples, leg 430 may be referred to as a second leg, transistor 420 may be referred to as a second transistor 420, resistor 440 may be referred to as a second resistive component 440 or a main resistive component 440. In some examples, each of the plurality of legs of the second leg group 415 may be coupled with a voltage source. Accordingly, a voltage may be applied to each leg of each second plurality of legs by activating a respective transistor. By activating a particular combination of transistors (e.g., applying a voltage to leg 430 by activating transistor 420), an impedance output (e.g., an impedance level) of the second leg group 415 may be adjusted.

In some examples, a determination of an output impedance level of the first leg group 410, the second leg group 415, or both may be made before adjusting a respective impedance level. For example, a memory controller (e.g., memory controller 110 as described with reference to FIG. 1) may determine an output impedance of at least one of the first leg group 410 or the second leg group 415 based at least in part on receiving the first data and the second data (e.g., first data received from leg group 410 and second data received from second leg group 415). In other examples, a determination of an output impedance level of the first partition 405 may be made before adjusting an impedance level of a respective leg group. For example, a memory controller (e.g., memory controller 110 as described with reference to FIG. 1) may determine an output impedance of the first partition 405 based at least in part on receiving the first data and the second data (e.g., first data received from first leg group 410 and second data received from second leg group 415).

In some examples, the memory controller may initiate an adjustment of first leg group 410 from a first impedance level to a second impedance level (e.g., a second impedance level different from the first impedance level, which is higher or lower) based at least in part on the determination. Additionally or alternatively, the memory controller may initiate an adjustment of the second leg group 415 from a third impedance level to a fourth impedance level (e.g., a fourth impedance level different from the third impedance level, which may be higher or lower) based at least in part on the determination. As described herein, an output impedance level of a particular partition may be adjusted by activating a combination of transistors to apply a voltage to a respective leg of the partition. A resistive component (e.g., first resistive component 445) coupled with the legs may then adjust an impedance level of the partition based at least in part on the application of the voltage.

In other examples, the memory controller may initiate an adjustment of the first partition 405 from a first impedance level to a second impedance level (e.g., a second impedance level different from the first impedance level, which may be higher or lower) based in part on the determination of an output impedance level of the first partition 405, or based in part on the determination of an output impedance level of one or more leg groups. Additionally or alternatively, the memory controller may initiate an adjustment of a second partition (not shown) from a third impedance level to a fourth impedance level (e.g., a fourth impedance level different from the third impedance level, which may be higher or lower) based at least in part on the determination. As described herein, an output impedance level of a particular partition may be adjusted by activating a combination of transistors of one or more leg groups to apply a voltage to the respective group. A resistive component coupled with a particular leg of the leg group may then adjust an impedance level of the leg group based at least in part on the application of the voltage.

In some examples, after an output impedance level of the first leg group 410 and/or the second leg group 415 is adjusted, an output impedance offset may be determined between the first output data and the second output data. Stated another way, the output impedance level of the first leg group 410 and the second leg group 415 may not be uniform after a first adjustment. Thus in some examples, based on determining an offset between the two impedance levels, at least a third adjustment may occur. For example, if an offset is determined between the two impedance levels, the impedance level of the first leg group 410 may be further-adjusted (e.g., to a fourth impedance level). In other examples, if an offset is determined between the two impedance levels, the impedance level of the second leg group 415 may be further-adjusted (e.g., to a fifth impedance level). As described herein, an impedance level of a particular partition may be adjusted by applying a voltage to one or more legs that are each coupled with a transistor and a resistive component by activating a particular transistor or combination of transistors.

In other examples, after an output impedance level of the first partition 405 and/or the second partition (not shown) has been adjusted, an output impedance offset may be determined between the data output from the respective partitions. Stated another way, the output impedance level of the first partition and the output impedance level of the second partition may not be uniform after a first adjustment. For example, an output impedance level of the first partition 405 may be greater or lesser than an output impedance level of the second partition (not shown) after a first adjustment. Thus in some examples, based on determining an offset between the two impedance levels, at least a third adjustment may occur. Additionally or alternatively, at least one of the partitions (e.g., first partition 405) may be calibrated based in part on a target impedance level (e.g., 120Ω). A memory controller may then, for example, determine a desirable impedance offset between the partitions, which may result in improved uniformity between the impedance levels output from multiple partitions.

In some examples, after adjusting an output impedance level of the first leg group 410, the second leg group 415, or both, the first data and second data may be output by the driver 400. The first data and second data may be output by, for example, control line 450.

Figure 5A:
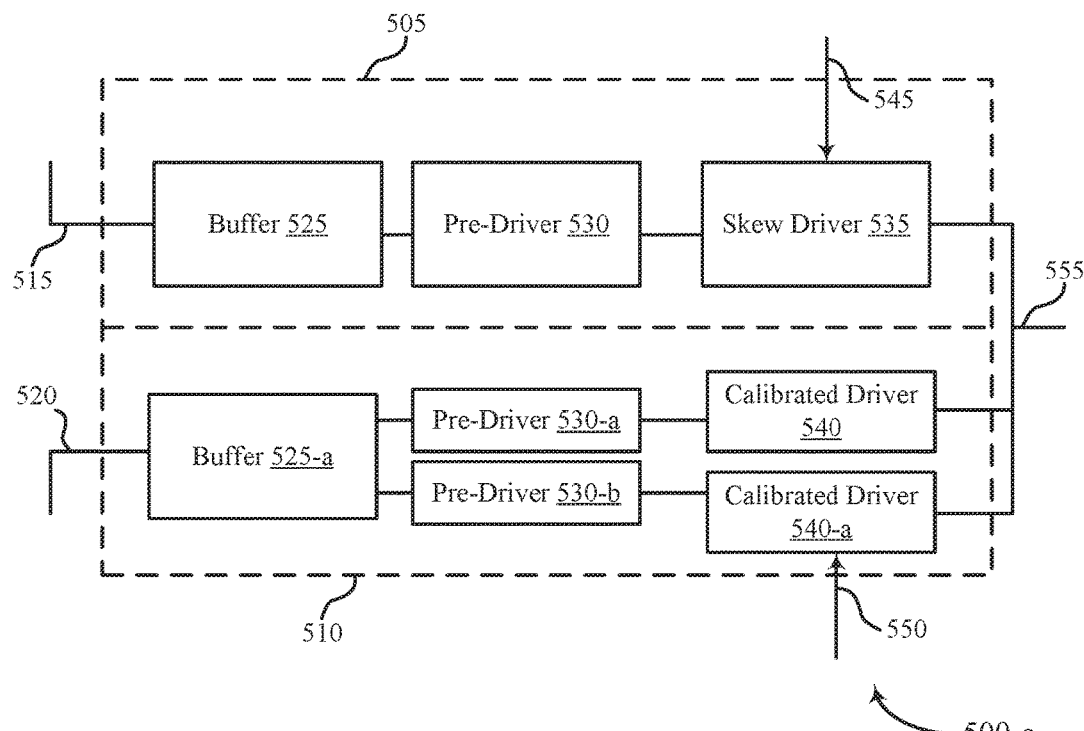
FIGS. 5A through 5B illustrate examples of a memory device that supports features and operations of output impedance calibration for signaling in accordance with examples of the present disclosure.

FIG. 5A illustrates an example memory device 500-a in accordance with various examples of the present disclosure. The memory device 500-a may also be referred to as memory driver 500-a and may be an example of driver 125 as described with reference to FIG. 1. Memory driver 500-a may be configured to utilize signaling to communicate data between various components of the memory subsystem 100. In some examples, this signaling to communicate data between various components may include, but is not limited to multi-level signaling (e.g., a signal that may be modulated using a modulation scheme that includes at least three levels to encode more than one bit of information including, but not limited to, PAM4 signaling). Memory driver 500-a may include partitions 505 and 510, which may be referred to as first partition 505 and second partition 510. In some examples, first partition 505 may include buffer 525, pre-driver 530, and first driver 535, which may be referred to as skew driver 535. Additionally or alternatively, second partition 510 may include buffer 525-*a*, pre-driver (e.g., pre driver 530 and 530-*a*), and second driver (e.g., second drivers 540 and 540-*a*), which may be referred to as calibrated drivers 540 and 540-*a*. In other examples, driver 500-*a* may be coupled with a memory controller (not shown).

In some examples, first partition 505 may receive first data via data input line 515. First data, in some cases, may be or may represent a least-significant bit of data (e.g., a LSB). Thus, in some examples, first partition 505 may be referred to as a LSB partition 505. In other examples, second partition 510 may receive second data via data input line 520. Second data may, in some cases, be or may represent a most-significant bit of data (e.g., a MSB). Thus, in some examples, second partition 510 may be referred to as a MSB partition 510.

After first data is received at the first partition 505, the data may be buffered at buffer 525. In some examples, after buffering, the first data may be forwarded to pre-driver 530. Pre-driver 530, for example, may be coupled with buffer 525 and skew driver 535 and may utilize a biasing circuit to generate a low-power signal. In some examples, the signal generated via pre-driver 530 may be transmitted to skew driver 535. The skew driver 535 may be configured to adjust an impedance level of the first partition 505 from a first impedance level to a second impedance level. In some examples, skew driver 535 may adjust an output impedance level based on an output voltage of the driver. For example, a higher output voltage of skew driver 535 may result in a lower output impedance level. The output voltage of the skew driver 535 may be adjusted (e.g., may be programmable) in some examples by adjusting a signal received via programming command 545 thus ultimately adjusting or aiding in the adjustment of the impedance level of the first partition 505.

In some examples, first partition 505 may include a plurality of legs configured to output data. For example, the plurality of legs may be coupled with or internal to skew driver 535. In other examples, each of the plurality of legs may be coupled with one or more transistors. As described herein, a voltage may be applied to one or more legs of the plurality of legs by activating a respective transistor, which may adjust an output impedance level of the first partition 505. In some examples, a voltage may be applied to one or more legs of the first partition 505 based on a programming command 545 sent to skew driver 535. Based on the programming command, a particular combination of transistors may be activated (e.g., those associated with or within skew driver 535), which may adjust an output impedance value of the first partition 505.

After second data is received at the second partition 510, the data may be buffered at buffer 525-*a*, which may be an example of buffer 525. In some examples, after buffering the first data, the first data may be forwarded to pre-drivers 530-*a* and 530-*b*. Pre-drivers 530-*a* and 530-*b*, for example, may be coupled with buffer 525-*a* and calibrated drivers 540 and 540-*a*, respectively. In some examples, pre-drivers 530-*a* and 530-*b* may each utilize a biasing circuit to generate a low-power signal. In some examples, the signal generated via pre-drivers 530-*a* and 530-*b* may be transmitted to calibrated driver 540 and 540-*a*. The calibrated drivers 540 and 540-*a* may be configured to adjust an impedance level of the second partition 510 from a third impedance level to a fourth impedance level. For example, the drive strength of calibrated drivers 540 and 540-*a* may be programmable (e.g., via programming command 550), which may adjust or aid in the adjustment of the impedance level of the second partition 510. In some examples, the calibrated drivers 540 and 540-*a* may operate to adjust an impedance level of a resistor internal to or associated with the respective driver. For example, the calibrated drivers 540 and 540-*a* may transmit one or more signals to the resistive component internal to or associated with the driver. The signals may correspond to a value of or close to the intended impedance of the respective resistive component. Accordingly, calibrated drivers 540 and 540-*a* may set, or aid in setting, the impedance values output from the second partition 510.

In some examples, second partition 510 may include a plurality of legs configured to output data. For example, the plurality of legs may be coupled with or internal to calibrated drivers 540 and 540-*a*. In other examples, each of the plurality of legs may be coupled with one or more transistors and one or more resistive components (e.g., one or more resistors). As described herein, a voltage may be applied to one or more legs by activating a respective transistor. This, in turn, may adjust an impedance level of the second partition 510 based on a resistance level of a resistor coupled with the second partition 510. In some examples, a voltage may be applied to one or more legs of the second partition 510 by transmitting a programming command 550 to calibrated drivers 540 and 540-*a*. Based on the programming command, a particular combination of transistors may be activated, which may adjust an output impedance value of the second partition 510 based on the resistance value of the resistor.

In some examples, after adjusting an output impedance level of the first partition 505, the second partition 510, or both, the first data and second data may be output by the driver 500-*a*. The first data and second data may be output by, for example, control line 555.

Figure 5B:
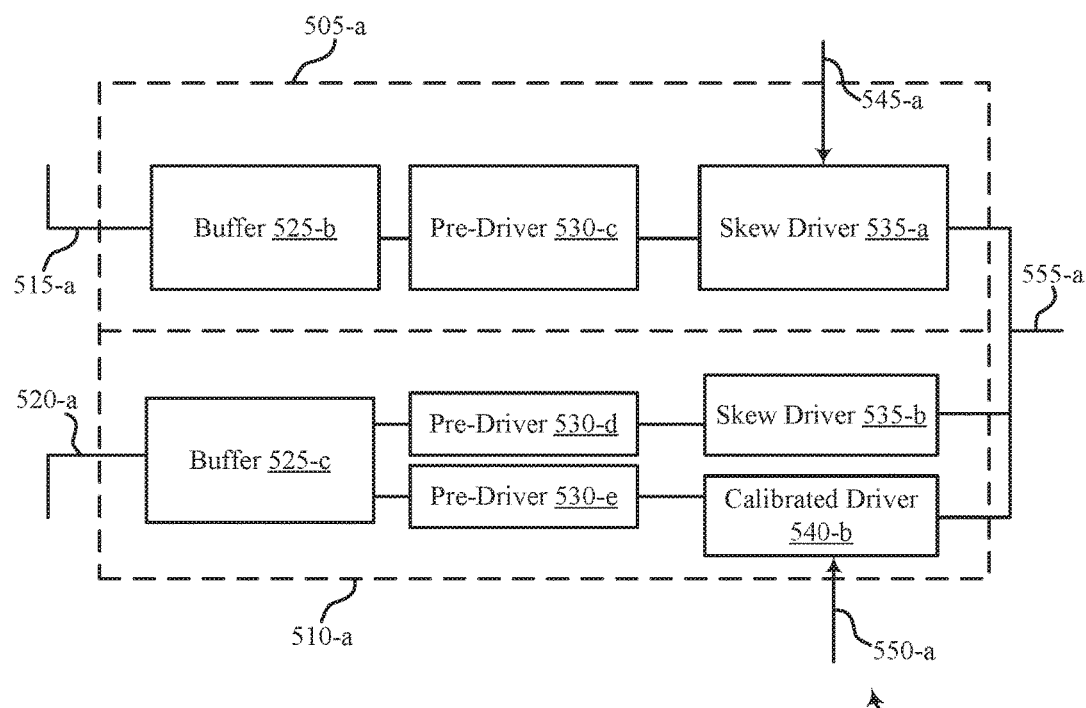

FIG. 5B illustrates an example memory device 500-*b* in accordance with various examples of the present disclosure. The memory device 500-*b* may also be referred to as memory driver 500-*b* and may be an example of driver 125 as described with reference to FIG. 1. Memory driver 500-*b* may be configured to utilize signaling to communicate data between various components of the memory subsystem 100. In some examples, this signaling to communicate data between various components may include, but is not limited to multi-level signaling (e.g., a signal that may be modulated using a modulation scheme that includes at least three levels to encode more than one bit of information including, but not limited to, PAM4 signaling). Memory driver 500-*b* may include partitions 505-*a* and 510-*a*, which may be referred to as first partition 505-*a* and second partition 510-*a*. In some examples, first partition 505-*a* may include buffer 525-*b*, pre-driver 530-*c*, and first driver 535-*a*, which may be referred to as skew driver 535-*a*. Additionally or alternatively, second partition 510-*a* may include buffer 525-*c*, pre-driver (e.g., pre driver 530-*d* and 530-*e*), and second driver 540-*b*, which may be referred to as calibrated driver 540-*b*. In other examples, second partition 510-*a* may include third driver 535-*b*, which may be referred to as skew driver 535-*b* or second skew driver 535-*b*. In other examples, driver 500-*a* may be coupled with a memory controller (not shown).

As described herein, first partition 505-*a* may receive first data via data input line 515-*a*, which may be or may represent a first bit (e.g., an LSB). In other examples, second partition 510-*a* may receive second data via data input line 520-*a*, which may be or may represent a second bit (e.g., a MSB). After first data is received at the first partition 505-*a*, the data may be buffered at buffer 525-*b*, and may subsequently be forwarded to pre-driver 530-*c*. Pre-driver 530-*c* may, in some cases, utilize a biasing circuit to generate a low-power signal and may transmit the signal to skew driver 535-*a*. The skew driver 535-*a* may be configured to adjust an impedance level of the first partition 505-*a* from a first impedance level to a second impedance level. In some examples, skew driver 535-*a* may adjust an output impedance level based on an output voltage of the driver. For example, a higher output voltage of skew driver 535-*a* may result in a lower output impedance level. The output voltage of the skew driver 535-*a* may be adjusted (e.g., may be programmable) in some examples by adjusting a signal received via programming command 545-*a* thus ultimately adjusting or aiding in the adjustment of the impedance level of the first partition 505-*a*.

In some examples, first partition 505-*a* may include a plurality of legs configured to output data. For example, the plurality of legs may be coupled with or internal to skew driver 535-*a*. In other examples, each of the plurality of legs may be coupled with one or more transistors. As described herein, a voltage may be applied to one or more legs of the plurality of legs by activating a respective transistor, which may adjust an output impedance level of the first partition 505-*a*. In some examples, a voltage may be applied to one or more legs of the first partition 505-*a* by transmitting a programming command 545-*a* to skew driver 535-*a*. Based on the programming command, a particular combination of transistors may be activated (e.g., those associated with or within skew driver 535-*a*), which may adjust an output impedance value of the first partition 505-*a*.

After second data is received at the second partition 510-*a*, the data may be buffered at buffer 525-*c* and may be forwarded to pre-drivers 530-*d* and 530-*e*. Pre-drivers 530-*d* and 530-*e*, for example, may be coupled with buffer 525-*c* and skew driver 535-*b* and calibrated driver 540-*b*, respectively. In some examples, pre-drivers 530-*d* and 530-*e* may each utilize a biasing circuit to generate a low-power signal, which may be transmitted to skew driver 535-*b* and calibrated driver 540-*b*. The skew driver 535-*b* and calibrated driver 540-*b* may be configured to adjust an impedance level of the second partition 510-*a* from a third impedance level to a fourth impedance level. For example, the drive strength of skew driver 535-*b* and calibrated driver 540-*b* may be programmable (e.g., via programming command 550-*a*), which may adjust or aid in the adjustment of the impedance level of the second partition 510-*a*.

In some examples, skew driver 535-*b* may adjust an output impedance level based on an output voltage of the driver. For example, a higher output voltage of skew driver 535-*b* may result in a lower output impedance level. The output voltage of the skew driver 535-*b* may be adjusted (e.g., programmable) in some examples by adjusting a signal received via programming command 550-*a* thus ultimately adjusting or aiding in the adjustment of the impedance level of the first partition 505. In some examples, the calibrated driver 540-*b* may operate to adjust an impedance level of a resistor internal to or associated with the driver. For example, the calibrated driver 540-*b* may transmit one or more signals to the resistive component internal to or associated with the driver. The signals may correspond to a value of or close to the intended impedance of the resistive component. Accordingly, calibrated driver 540-*b* may set, or aid in setting, the impedance values output from the second partition 510. Thus, in some examples, skew driver 535-*b* and calibrated driver 540-*b* may each adjust a portion of the output impedance level of the second partition 510-*a*.

In some examples, second partition 510-*a* may include a plurality of legs configured to output data. For example, the plurality of legs may be coupled with or internal to one or both of skew driver 535-*b* and calibrated driver 540-*b*. In other examples, each of the plurality of legs may be coupled with one or more transistors and one or more resistive components (e.g., one or more resistors). As described herein, a voltage may be applied to one or more legs by activating a respective transistor.

This, in turn, may adjust an impedance level of the second partition 510-*a* based on a resistance level of a resistor coupled with the second partition 510. For example, skew driver 535-*b* may be coupled with a plurality of legs that each include one or more transistors, and calibrated driver 540-*b* may be coupled with a plurality of legs that each include one or more transistors and one or more resistors.

In some examples, a voltage may be applied to one or more legs of the second partition 510-*a* by transmitting a programming command 550-*a* to skew driver 535-*b* and calibrated driver 540-*b*. Based on the programming command, a particular combination of transistors associated with legs of skew driver 535-*b* may be activated, and a particular combination of transistors associated with legs of calibrated driver 540-*b* may be activated. By activating a particular combination of transistors associated with skew driver 535-*b* may partially adjust an output impedance value of the second partition. Activating a particular combination of transistors associated with calibrated driver 540-*b*, may partially adjust an output impedance value of the second partition 510-*a* based on the resistance value of the resistor. Thus both skew driver 535-*b* and calibrated driver 540-*b* may adjust an output impedance value of the second partition 510-*a*. By including a skew driver 535-*b* and a calibrated driver 540-*b* in the second partition 510-*a*, the output impedance level of the second partition 510-*a* may be adjusted with different (e.g., greater) granularity than the second partition 510 described above.

In some examples, after adjusting an output impedance level of the first partition 505-*a*, the second partition 510-*a*, or both, the first data and second data may be output by the driver 500-*b*. The first data and second data may be output by, for example, control line 555-*a*.

Figure 6:
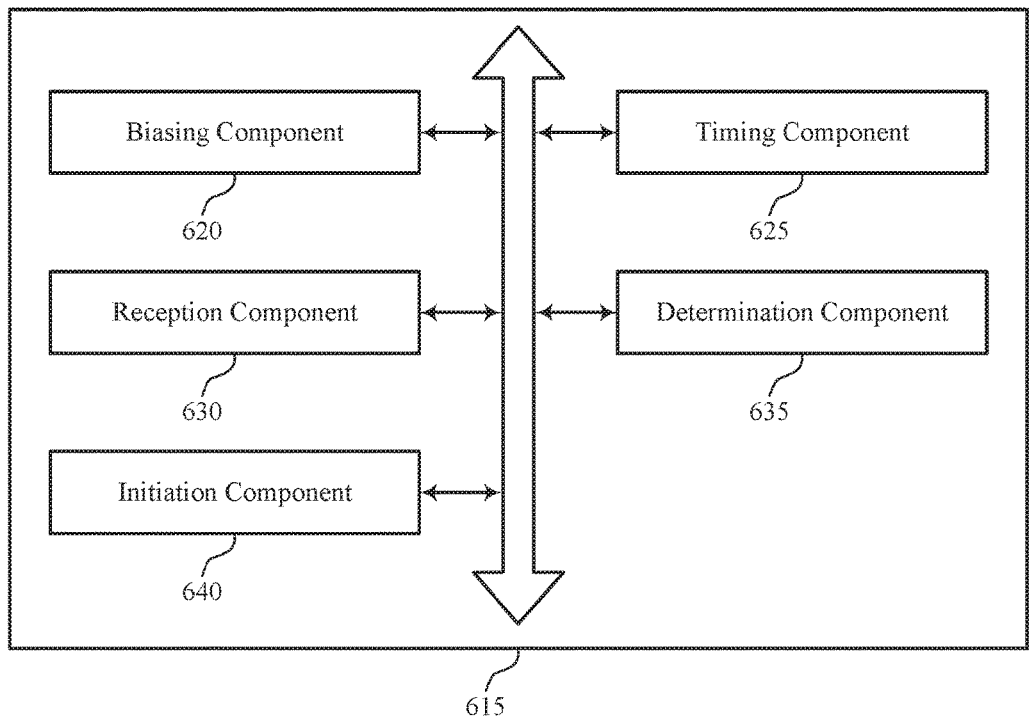
FIG. 6 illustrates a block diagram of a device that supports output impedance calibration for signaling in accordance with examples of the present disclosure.

FIG. 6 shows a block diagram 600 of an impedance adjustment component 615 that supports output impedance calibration for signaling in accordance with examples of the present disclosure. The impedance adjustment component 615 may be an example of aspects of an impedance adjustment component 715 described with reference to FIG. 7. The impedance adjustment component 615 may include biasing component 620, timing component 625, reception component 630, determination component 635, and initiation component 640. Each of these modules may communicate, directly or indirectly, with one another (e.g., via one or more buses).

Reception component 630 may receive first data output from a first partition of a driver and second data output from a second partition of the driver.

Determination component 635 may determine an output impedance of at least one of the first partition or the second partition based on receiving the first data and the second data. In some examples, determination component 635 may determine an output impedance offset between the first data and the second data after initiating the adjustment of the first partition to the second impedance level. In other examples, initiating the adjustment of the first partition, the second partition, or both is based on the output impedance offset.

Initiation component 640 may initiate an adjustment of the first partition from a first impedance level to a second impedance level based on the operations conducted by determination component 635. In some examples, initiation component 640 may initiate an adjustment of the second partition from a third impedance level to a fourth impedance level based on the operations conducted by determination component 635. In other examples, initiation component 640 may initiate the adjustment of the impedance level of the first partition, which includes activating a first leg of a set of legs of the first partition. In some examples, the first leg may include a first transistor coupled with a first resistive component.

In other examples, initiating the adjustment of the impedance level of the second partition may include activating a second leg that may include a second transistor coupled with a second resistive component. Additionally or alternatively, initiation component 640 may initiate the adjustment of the impedance level of the first partition by further-activating activating at least one additional leg of the set of legs. In some examples, each of the additional legs may include a transistor. In other examples, the second partition may include at least one binary weighted leg. In some cases, the transistor of each of the set of legs may be coupled with an additional resistive component.

Figure 7:
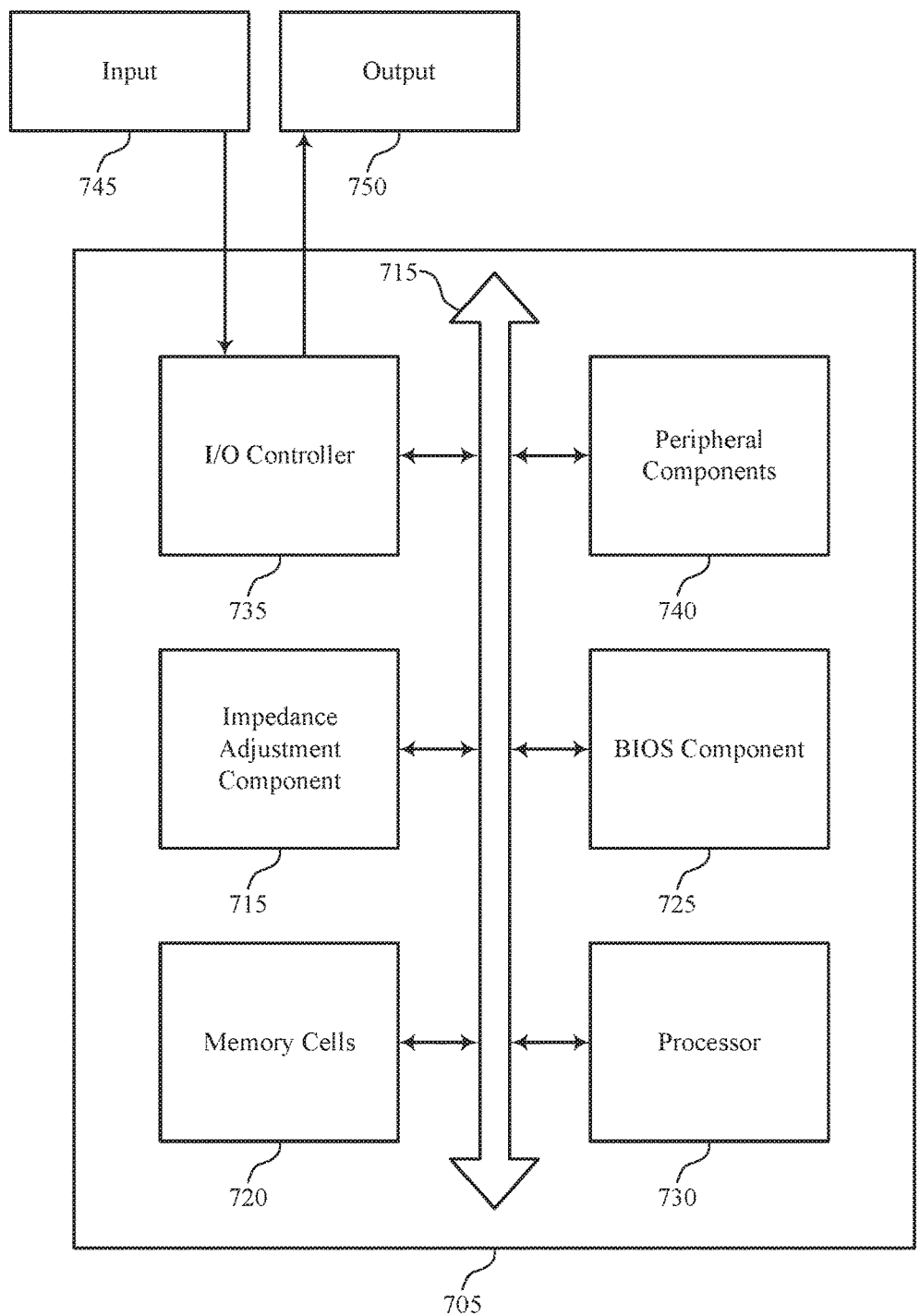
FIG. 7 illustrates a block diagram of a system including a driver that supports output impedance calibration for signaling in accordance with examples of the present disclosure.

FIG. 7 shows a diagram of a system 700 including a device 705 that supports output impedance calibration for signaling in accordance with examples of the present disclosure. Device 705 may be an example of or include the components of driver as described herein, e.g., with reference to FIGS. 3, 4, 5A, and 5B. Device 705 may include components for bi-directional voice and data communications including components for transmitting and receiving communications, including impedance adjustment component 715, memory cells 720, basic input/output system (BIOS) component 725, processor 730, I/O controller 735, and peripheral components 740. These components may be in electronic communication via one or more buses (e.g., bus 710).

Memory cells 720 may store information (i.e., in the form of a logical state) as described herein.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 730 may be configured to operate a memory array using a memory controller. In other cases, a memory controller may be integrated into processor 730. Processor 730 may be configured to execute computer-readable instructions stored in a memory to perform various functions (e.g., functions or tasks supporting output impedance calibration for signaling, including, but not limited to multi-level signaling such as that including a signal that may be modulated using a modulation scheme that includes at least three levels to encode more than one bit of information). In some examples, processor 730 may be configured to execute computer-readable instructions stored in a memory to initiate an adjustment of an output impedance level of a first partition (e.g., first partition 305 as described with reference to FIG. 3) or of a second partition of a driver.

I/O controller 735 may manage input and output signals for device 705. I/O controller 735 may also manage peripherals not integrated into device 705. In some cases, I/O controller 735 may represent a physical connection or port to an external peripheral. In some cases, I/O controller 735 may utilize an operating system such as iOS®, ANDROID®, MS-DOS®, MS-WINDOWS®, OS/2®, UNIX®, LINUX®, or another known operating system. In other cases, I/O controller 735 may represent or interact with a modem, a keyboard, a mouse, a touchscreen, or a similar device. In some cases, I/O controller 735 may be implemented as part of a processor. In some cases, a user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a display, audio speakers, a printing device, another processor or printed circuit board, etc. In some cases, output 750 may be a peripheral element that interfaces with device 705 via peripheral component(s) 740. In some cases, output 750 may be managed by I/O controller 735

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device.

Figure 8:
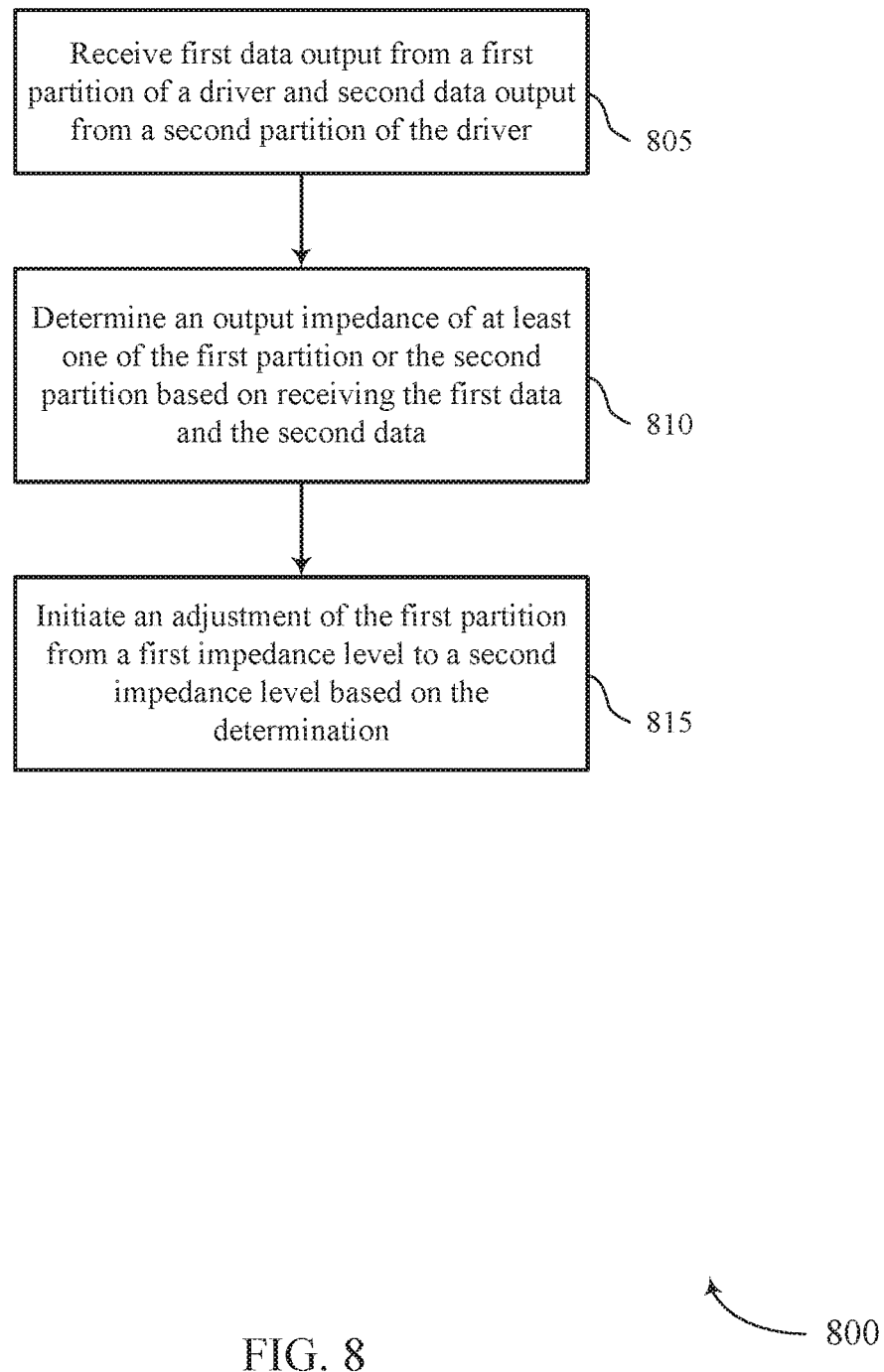
FIGS. 8 through 9 illustrate methods for output impedance calibration for signaling in accordance with examples of the present disclosure.

FIG. 8 shows a flowchart illustrating a method 800 for output impedance calibration for signaling in accordance with examples of the present disclosure. The operations of method 800 may be implemented by a driver or its components as described herein. For example, the operations of method 800 may be performed by an impedance adjustment component as described with reference to FIG. 6. In some examples, a driver may execute a set of codes to control the functional elements of the device to perform the functions described below. Additionally or alternatively, the driver may perform aspects of the functions described below using special-purpose hardware.

At 805 the driver may receive first data output from a first partition of the driver and second data output from a second partition of the driver. The operations of 805 may be performed according to the methods described herein. In certain examples, aspects of the operations of 805 may be performed by a reception component as described with reference to FIG. 6.

At 810 the driver may determine an output impedance of at least one of the first partition or the second partition based at least in part on receiving the first data and the second data. The operations of 810 may be performed according to the methods described herein. In certain examples, aspects of the operations of 810 may be performed by a determination component as described with reference to FIG. 6.

At 815 the driver may initiate an adjustment of the first partition from a first impedance level to a second impedance level based at least in part on the determination. The operations of 815 may be performed according to the methods described herein. In certain examples, aspects of the operations of 815 may be performed by an initiation component as described with reference to FIG. 6.

Figure 9:
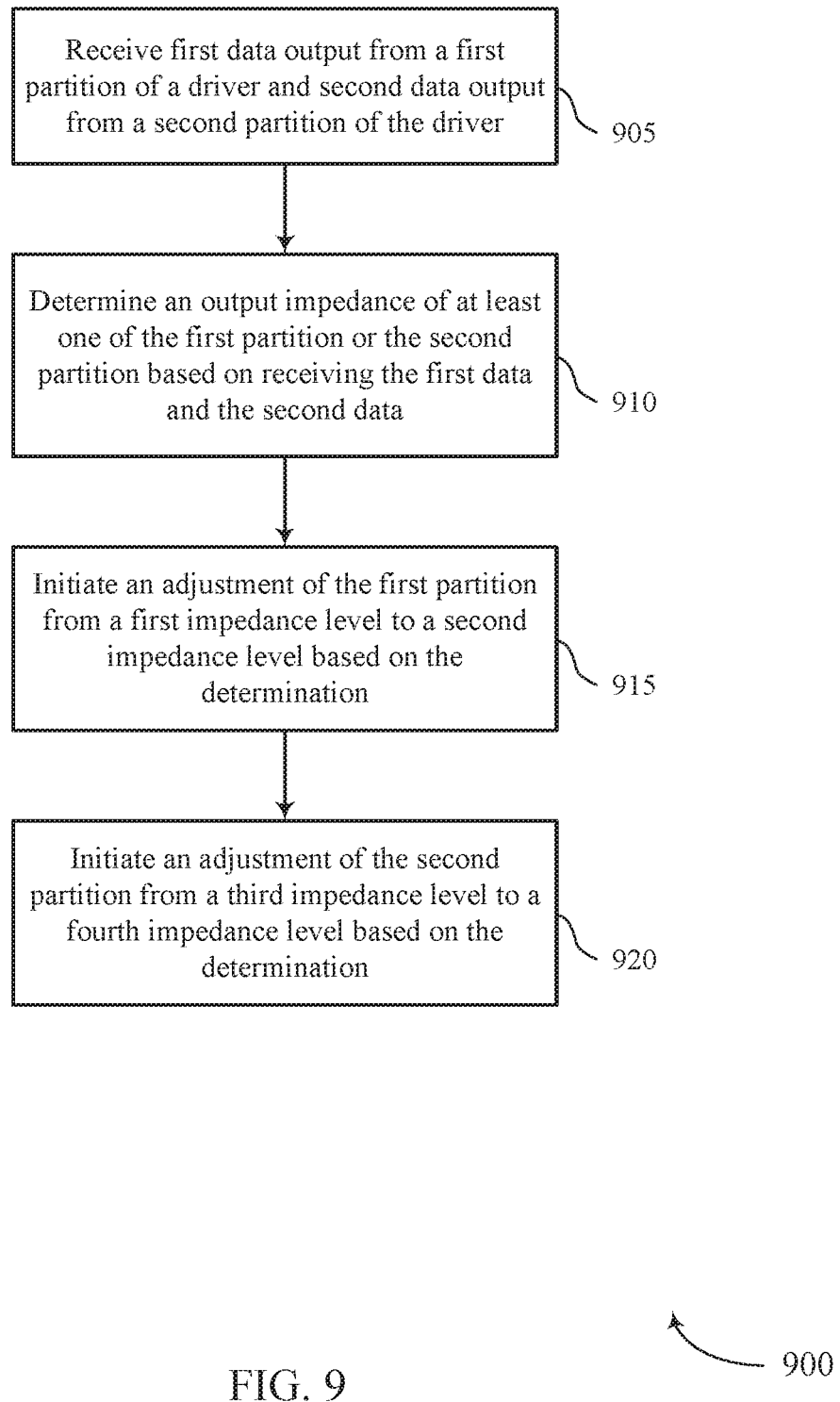

FIG. 9 shows a flowchart illustrating a method 900 for output impedance calibration for signaling in accordance with examples of the present disclosure. The operations of method 900 may be implemented by a driver or its components as described herein. For example, the operations of method 900 may be performed by an impedance adjustment component as described with reference to FIG. 6. In some examples, a driver may execute a set of codes to control the functional elements of the device to perform the functions described below. Additionally or alternatively, the driver may perform aspects of the functions described below using special-purpose hardware.

At 905 the driver may receive first data output from a first partition of the driver and second data output from a second partition of the driver. The operations of 905 may be performed according to the methods described herein. In certain examples, aspects of the operations of 905 may be performed by a reception component as described with reference to FIG. 6.

At 910 the driver may determine an output impedance of at least one of the first partition or the second partition based at least in part on receiving the first data and the second data. The operations of 910 may be performed according to the methods described herein. In certain examples, aspects of the operations of 910 may be performed by a determination component as described with reference to FIG. 6.

At 915 the driver may initiate an adjustment of the first partition from a first impedance level to a second impedance level based at least in part on the determination. The operations of 915 may be performed according to the methods described herein. In certain examples, aspects of the operations of 915 may be performed by an initiation component as described with reference to FIG. 6.

At 920 the driver may initiate an adjustment of the second partition from a third impedance level to a fourth impedance level based at least in part on the determination. The operations of 920 may be performed according to the methods described herein. In certain examples, aspects of the operations of 920 may be performed by an initiation component as described with reference to FIG. 6.

In some cases, the method may include receiving first data output from a first partition of a driver and second data output from a second partition of the driver. In some examples, the method may include determining an output impedance of at least one of the first partition or the second partition based at least in part on receiving the first data and the second data. Additionally or alternatively, the method may include initiating an adjustment of the first partition from a first impedance level to a second impedance level based at least in part on the determination.

In some examples, the method may include initiating an adjustment of the second partition from a third impedance level to a fourth impedance level based at least in part on the determination. In some examples, at least one leg group of the first partition may include at least one binary weighted leg. In other examples, the method may include determining an output impedance offset between the first data and the second data after initiating the adjustment of the first partition to the second impedance level. In some examples, initiating the adjustment of the first partition, the second partition, or both may be based at least in part on the output impedance offset.

In some examples, the method may include initiating the adjustment of the impedance level of the first partition by activating a first leg of a plurality of legs of a first leg group of the first partition. In some examples, the first leg of the first leg group may include a first transistor coupled with a first resistive component. In other examples, initiating the adjustment of the impedance level of the first partition may include activating a second leg of a second leg group that includes a second transistor coupled with a second resistive component. In other cases, the method may include initiating the adjustment of the impedance level of the first partition by activating at least one additional leg of the plurality of legs of the first leg group. In some examples, each leg may include a transistor. In other cases, the transistor of each of the plurality of legs may be coupled with an additional resistive component.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory subsystem 100.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory subsystem 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a multi-leg driver that comprises a first partition and a second partition, wherein the first partition is configured to output first data and the second partition is configured to output second data;
   a controller coupled with the multi-leg driver, the controller configured to determine an output impedance of at least one of the first partition or the second partition, wherein the first data output from the first partition comprises multiple bits including a most-significant bit of data, and the second data output from the second partition comprises multiple bits including a least-significant bit of data;
   a first transistor coupled with a first leg group of the first partition, the first transistor configured to adjust an impedance level of at least one leg of the first leg group based at least in part on the controller determining the output impedance of the at least one of the first partition or the second partition;
   a second transistor coupled with at least one leg of a second leg group of the first partition, the second transistor configured to adjust a voltage level of the at least one leg of the second leg group based at least in part on the controller determining the output impedance of the at least one of the first partition or the second partition; and
   a second resistive component coupled with the leg group, wherein the second resistive component is configured to adjust an impedance level of the first partition based at least in part on the second transistor adjusting a voltage level of the at least one leg of the second leg group.

2. The apparatus of claim 1, further comprising:
   a first resistive component coupled with the first leg group, wherein the first resistive component is configured to adjust an impedance level of the first partition based at least in part on the first transistor adjusting a voltage level of the at least one leg of the first leg group.

3. The apparatus of claim 1, wherein each of the first transistor and the second transistor are pull-down transistors.

4. The apparatus of claim 1, further comprising:
   a plurality of legs coupled with the first leg group, wherein each of the plurality of legs comprises a transistor coupled with a resistive component, wherein each of the plurality of resistive components is configured to further adjust an impedance level of the first partition.

5. An apparatus, comprising:
   a first partition of a driver comprising a first driver configured to output first data, the first driver configured to adjust an impedance level of the first partition from a first impedance level to a second impedance level;
   a second partition of the driver comprising a second driver configured to output second data, the second driver configured to adjust an impedance level of the second partition based at least in part on a resistance level of a resistor coupled with the second partition, wherein an impedance level of the first data output from the first partition is offset from an impedance level of the second data output from the second partition; and
   a controller coupled with the driver, the controller configured to determine an output impedance of the first partition, the second partition, or both.

6. An apparatus, comprising:
   a first partition of a driver comprising a first driver configured to output first data, the first driver configured to adjust an impedance level of the first partition from a first impedance level to a second impedance level;
   a second partition of the driver comprising a second driver configured to output second data, the second driver configured to adjust an impedance level of the second partition based at least in part on a resistance level of a resistor coupled with the second partition, wherein the second partition of the driver further comprises a third driver coupled with the second driver, the third driver configured to adjust the impedance level of the second partition; and
   a controller coupled with the driver, the controller configured to determine an output impedance of the first partition, the second partition, or both, and wherein the third driver is configured to adjust the impedance level of the second partition based at least in part on the controller determining the output impedance of the first partition.

7. The apparatus of claim 6, wherein the third driver is a same driver type as the first driver.

8. The apparatus of claim 5, wherein the first driver is configured to adjust the impedance level of the first partition based at least in part on a voltage level across at least one of a first plurality of legs of the first partition.

9. The apparatus of claim 5, wherein the resistance level of the resistor is based at least in part on a voltage level across at least one of a second plurality of legs of the second partition coupled with the resistor.

10. A method, comprising:
    receiving first data at a first partition of a memory device, the first partition comprising a first driver;
    adjusting, by the first driver, an impedance level of the first data from a first impedance level to a second impedance level based at least in part on a voltage of the first driver;
    receiving second data at a second partition of the memory device, the second partition comprising a second driver;
    adjusting, by the second driver, an impedance level of the second data from a third impedance level to a fourth impedance level based at least in part on a resistance level of the second driver; and outputting, from the memory device, the first data having the second impedance level and the second data having the fourth impedance level based at least in part on adjusting the first data and adjusting the second data, wherein the second impedance level of the first data and the fourth impedance level of the second data are different impedance levels.

11. A method, comprising:

receiving first data at a first partition of a memory device, the first partition comprising a first driver;

adjusting, by the first driver, an impedance level of the first data from a first impedance level to a second impedance level based at least in part on a voltage of the first driver;

receiving second data at a second partition of the memory device, the second partition comprising a second driver;

adjusting, by the second driver, an impedance level of the second data from a third impedance level to a fourth impedance level based at least in part on a resistance level of the second driver;

receiving a portion of the second data at a third driver of the second partition of the memory device;

adjusting, by the third driver, an impedance level of the portion of the second data from the third impedance level to a fifth impedance level;

outputting, from the third driver, the portion of the second data based at least in part on adjusting the impedance level of the portion of the second data, wherein outputting the second data having the fourth impedance level is based at least in part on outputting the portion of the second data; and outputting, from the memory device, the first data having the second impedance level and the second data having the fourth impedance level based at least in part on adjusting the first data and adjusting the second data.

12. The method of claim 10, wherein adjusting the impedance level of the first data comprises:

receiving, at the first driver, a first command configured to activate the first driver; and applying a first voltage, based at least in part on a transistor of the respective leg being activated, to one or more legs of a plurality of legs of the first driver.

13. The method of claim 12, wherein adjusting the impedance level of the second data comprises:

receiving, at the second driver, a second command configured to activate the second driver based at least in part on applying the first voltage to the one or more legs of the plurality of legs of the first driver; and applying a second voltage, based at least in part on a transistor of the respective leg being activated, to one or more legs of a plurality of legs of the second driver.

14. The method of claim 10, wherein the first data comprises a least significant bit of data and the second data comprises a most significant bit of data.

15. The method of claim 10, wherein outputting the first data and the second data comprises:

outputting the first data and the second data concurrently.

* * * * *